United States Patent
Kim et al.

(10) Patent No.: US 11,437,847 B2
(45) Date of Patent: Sep. 6, 2022

(54) FOLDABLE ELECTRONIC DEVICE INCLUDING RECEIVING COIL FOR WIRELESS CHARGING

(71) Applicant: Samsung Electronics Co., Ltd., Gyeonggi-do (KR)

(72) Inventors: Yongyoun Kim, Gyeonggi-do (KR); Haeyeon Kim, Gyeonggi-do (KR); Taekyung Lee, Gyeonggi-do (KR); Taeyun Lee, Gyeonggi-do (KR); Hyoseok Na, Gyeonggi-do (KR); Soyoung Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 257 days.

(21) Appl. No.: 16/824,357

(22) Filed: Mar. 19, 2020

(65) Prior Publication Data
US 2020/0303955 A1    Sep. 24, 2020

(30) Foreign Application Priority Data

Mar. 20, 2019 (KR) ........................ 10-2019-0031709

(51) Int. Cl.
*H01M 10/46* (2006.01)
*H02J 50/00* (2016.01)
(Continued)

(52) U.S. Cl.
CPC .......... *H02J 50/005* (2020.01); *H02J 7/0042* (2013.01); *H02J 50/10* (2016.02); *H04M 1/0268* (2013.01);
(Continued)

(58) Field of Classification Search
CPC ........ H02J 7/0042; H02J 50/10; H02J 50/005; H04M 1/0268; H04M 1/022;
(Continued)

(56) References Cited

U.S. PATENT DOCUMENTS 9,918,395 B1    3/2018  Harmon et al.
10,347,966 B2   7/2019  Lee et al.
(Continued)

FOREIGN PATENT DOCUMENTS

CN    111261037 A  *  6/2020  ........... G06F 1/1632
CN    112288972 A  *  1/2021  ........... H02J 7/0042
(Continued)

OTHER PUBLICATIONS

International Search Report dated Jul. 6, 2020 issued in counterpart application No. PCT/KR2020/003793, 10 pages.

*Primary Examiner* — Edward Tso
(74) *Attorney, Agent, or Firm* — The Farrell Law Firm, P.C.

(57) ABSTRACT

A foldable electronic device is provided, which includes a display having a first display area and a second display area that are arranged in a same direction when the foldable electronic device is in a flat state. The foldable electronic device further includes a first housing structure that surrounds at least part of the first display area, a second housing structure that is connected to the first housing structure and that surrounds at least part of the second display area, and a first receiving coil disposed in a first magnetic field area at an edge of the first housing structure.

20 Claims, 18 Drawing Sheets

(51) Int. Cl.
  *H02J 50/10*    (2016.01)
  *H02J 7/00*    (2006.01)
  *H05K 5/02*    (2006.01)
  *H05K 5/00*    (2006.01)
  *H04M 1/02*    (2006.01)

(52) U.S. Cl.
  CPC ......... *H05K 5/0017* (2013.01); *H05K 5/0226* (2013.01)

(58) Field of Classification Search
  CPC ... G06F 1/1616; G06F 1/1652; H05K 5/0017; H05K 5/0026
  USPC ................................ 320/107, 108, 114, 115
  See application file for complete search history.

(56) References Cited

U.S. PATENT DOCUMENTS

| | | |
|---|---|---|
| 2017/0179773 A1 | 6/2017 | Kim et al. |
| 2018/0077806 A1 | 3/2018 | Harmon et al. |
| 2018/0151943 A1 | 5/2018 | Lee et al. |
| 2018/0242446 A1 | 8/2018 | Cho et al. |

FOREIGN PATENT DOCUMENTS

| | | | | |
|---|---|---|---|---|
| CN | 112510779 A | * | 3/2021 | .............. H02J 50/10 |
| JP | 2011-232550 | | 11/2011 | |
| JP | 2017-510122 | | 4/2017 | |
| KR | 10-2017-0094748 | | 8/2017 | |
| KR | 20200133513 A | * | 11/2020 | ........... G06F 1/1632 |
| WO | WO 2014/102883 | | 7/2014 | |

* cited by examiner

FOLDABLE ELECTRONIC DEVICE INCLUDING RECEIVING COIL FOR WIRELESS CHARGING

CROSS-REFERENCE TO RELATED APPLICATION(S)

This application is based on and claims priority under 35 U.S.C. § 119 to Korean Patent Application No. 10-2019-0031709, filed on Mar. 20, 2019, in the Korean Intellectual Property Office, the entire disclosure of which is incorporated herein by reference.

BACKGROUND

1. Field

The disclosure relates generally to a foldable electronic device.

2. Description of Related Art

An electronic device such as a smartphone may include a receiving coil in connection with charging a battery. For example, the receiving coil may correspond to a transmitting coil of a wireless charger to form a magnetic field. The magnetic field may generate an induced current in the receiving coil and charge the battery of the electronic device.

SUMMARY

An aspect of the disclosure is to provide a flexible display including two display areas that form one connected screen, wherein the two display areas may be bent in different directions.

Another aspect of the disclosure is to provide to provide a flexible display including two display areas, wherein when the two display areas are in a flat state, a receiving coil is biased to one side from a central portion of the electronic device.

In accordance with an aspect of the disclosure, a foldable electronic device is provided, which includes a display having a first display area and a second display area that face a same direction when foldable electronic device is in a flat state, a first housing structure that surrounds at least part of the first display area, a second housing structure that is connected to the first housing structure and that surrounds at least part of the second display area, and a first receiving coil disposed in a first magnetic field area at an edge of the first housing structure.

In accordance with another aspect of the disclosure, a foldable electronic device is provided, which includes a display having a first display area and a second display area that face a same direction when foldable electronic device is in a flat state, a first housing structure that surrounds at least part of the first display area, a second housing structure that is connected to the first housing structure and that surrounds at least part of the second display area, and a first receiving coil disposed in a first magnetic field area at an edge of the first housing structure. The first housing structure includes at least one of a first slit formed in the first magnetic field area adjacent to a first end of the first receiving coil and a second slit formed in the first magnetic field area adjacent to a second end of the first receiving coil.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure.

Figure 1:
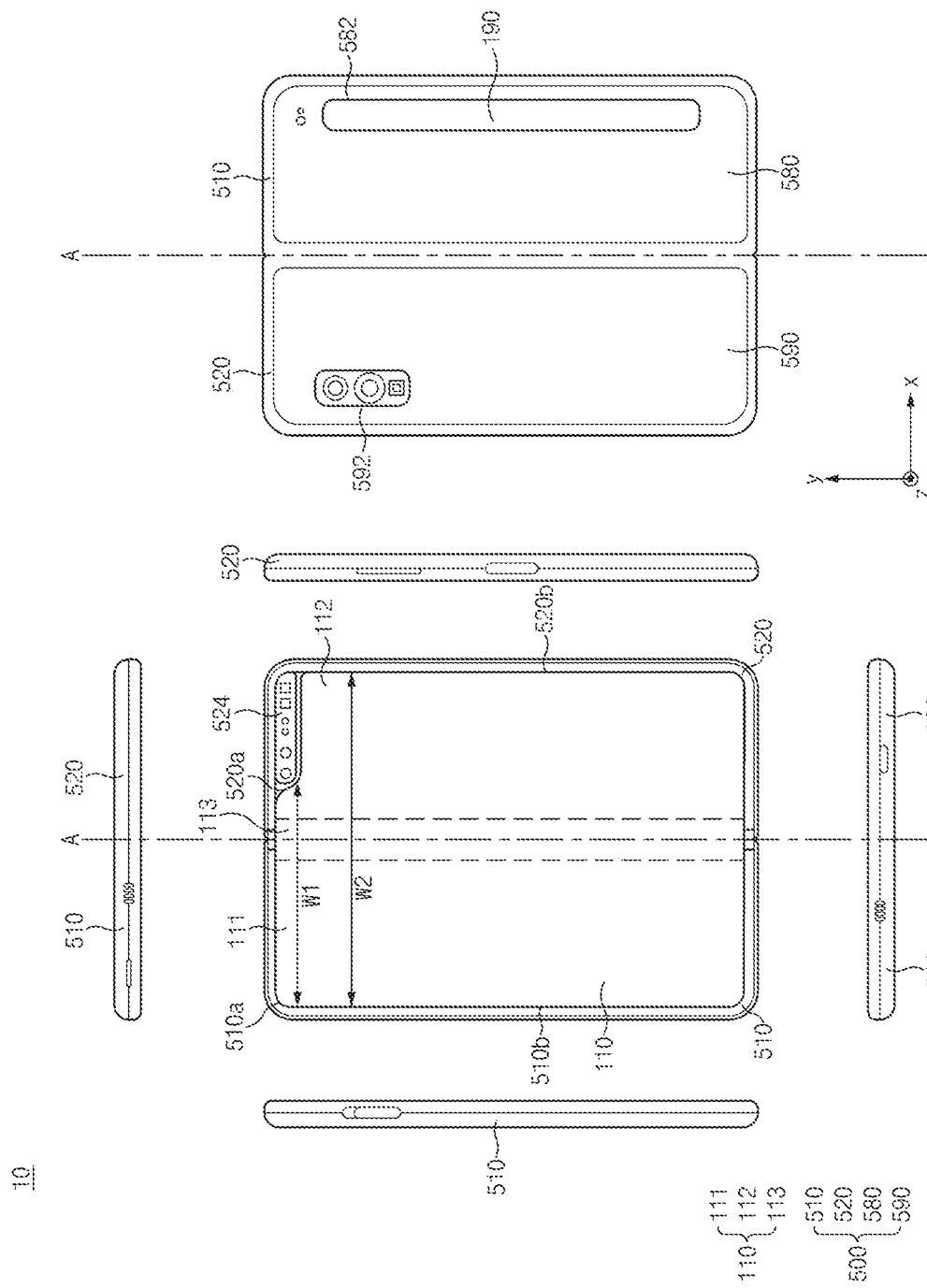
FIG. 1 illustrates a flat state of an electronic device according to an embodiment.
Figure 2:
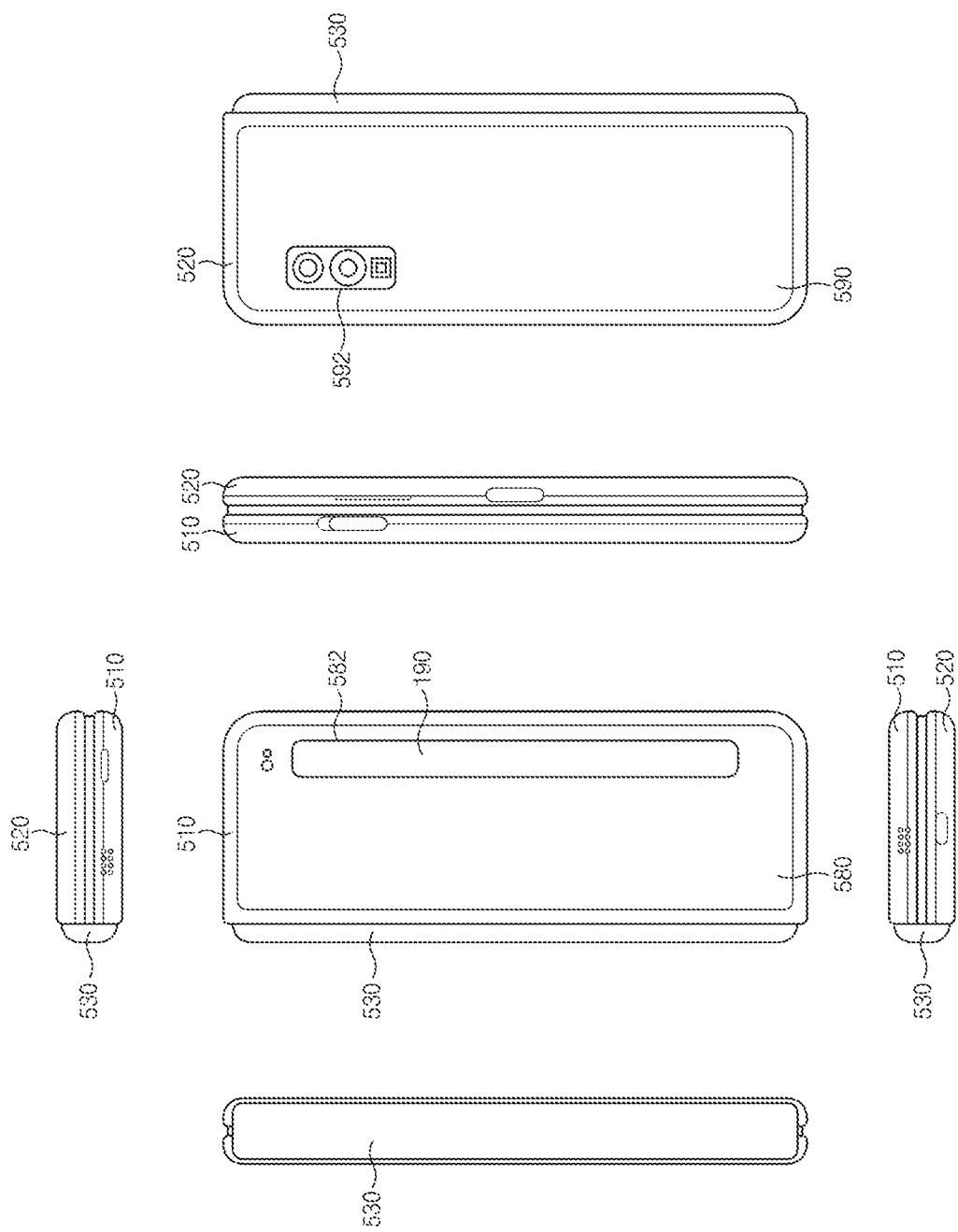
FIG. 2 illustrates a folded state of an electronic device according to an embodiment.

FIG. 1 illustrates a flat state of an electronic device according to an embodiment. FIG. 2 illustrates a folded state of an electronic device according to an embodiment.

Referring to FIGS. 1 and 2, an electronic device 10 includes a foldable housing 500, a hinge cover 530 that covers a foldable portion of the foldable housing 500, and a flexible or foldable display 110 that is disposed in a space formed by the foldable housing 500. A surface on which the display 110 is disposed may be referred to as a first surface or a front surface of the electronic device 10. An opposite surface to the front surface may be referred to as a second surface or a rear surface of the electronic device 10. The surfaces that surround a space between the front surface and the rear surface may be referred to as third surfaces or side surfaces of the electronic device 10.

The foldable housing 500 includes a first housing structure 510, a second housing structure 520 including a sensor area 524, a first back cover 580, and a second back cover 590. The foldable housing 500 is not limited to the form and coupling illustrated in FIGS. 1 and 2 and may be implemented by a combination and/or coupling of other shapes or parts. For example, the first housing structure 510 and the first back cover 580 may be integrated with each other, and the second housing structure 520 and the second back cover 590 may be integrated with each other.

The first housing structure 510 and the second housing structure 520 may be disposed on opposite sides of a folding axis (axis A) and may have shapes that are entirely symmetric to each other with respect to the folding axis A. The angle or distance between the first housing structure 510 and the second housing structure 520 may vary depending on whether the electronic device 10 is in a flat state, a folded state, or an intermediate state. The second housing structure 520 additionally includes a sensor area 524 in which various sensors are disposed. The first housing structure 510 and the second housing structure 520 have a mutually symmetrical shape in the other areas.

The first housing structure 510 and the second housing structure 520 may form a recess in which the display 110 is received. Due to the sensor area 524, the recess may have two or more different widths in a direction perpendicular to the folding axis A.

For example, the recess may have (1) a first width w1 between a first portion 510a of the first housing structure 510 that is parallel to the folding axis A and a first portion 520a of the second housing structure 520 that is formed on the periphery of the sensor area 524 and (2) a second width w2 between a second portion 510b of the first housing structure 510 and a second portion 520b of the second housing structure 520 that does not correspond to the sensor area 524 and that is parallel to the folding axis A. The second width w2 may be formed to be greater than the first width w1. That is, the first portion 510a of the first housing structure 510 and the first portion 520a of the second housing structure 520 that have mutually asymmetrical shapes may form the first width w1 of the recess, and the second portion 510b of the first housing structure 510 and the second portion 520b of the second housing structure 520 that have mutually symmetrical shapes may form the second width w2 of the recess.

The first portion 520a and the second portion 520b of the second housing structure 520 may have different distances from the folding axis A. The widths of the recess are not limited to the illustrated example. For example, the recess may have a plurality of widths depending on the form of the sensor area 524 or the asymmetrical portions of the first housing structure 510 and the second housing structure 520.

At least part of the first housing structure 510 and at least part of the second housing structure 520 may be formed of a metallic material or a non-metallic material that has a stiffness selected to support the display 110.

The sensor area 524 may have a predetermined area formed adjacent to one corner of the second housing structure 520. However, the arrangement, shape, and size of the sensor area 524 are not limited to the illustrated example. For example, the sensor area 524 may be provided in another corner of the second housing structure 520 or in any area between an upper corner and a lower corner of the second housing structure 520.

Parts embedded in the electronic device 10 to perform various functions may be exposed on the front surface of the electronic device 10 though the sensor area 524 or through one or more openings formed in the sensor area 524. The parts may include various types of sensors, such as a front camera, a receiver, and/or a proximity sensor.

The first back cover 580 may be disposed on one side of the folding axis A on the rear surface of the electronic device 10. The first back cover 580 may have a substantially rectangular periphery, and the periphery may be surrounded by the first housing structure 510. Similarly, the second back cover 590 may be disposed on an opposite side of the folding axis A on the rear surface of the electronic device 10 and may have a periphery surrounded by the second housing structure 520.

The first back cover 580 and the second back cover 590 may have substantially symmetrical shapes with respect to the folding axis (the axis A). However, the first back cover 580 and the second back cover 590 do not necessarily have to have mutually symmetrical shapes. The electronic device 10 may include the first back cover 580 and the second back cover 590 that have various shapes. Alternatively, the first back cover 580 may be integrated with the first housing structure 510, and the second back cover 590 may be integrated with the second housing structure 520.

The first back cover 580, the second back cover 590, the first housing structure 510, and the second housing structure 520 may form a space in which various parts (e.g., a printed circuit board (PCB) or a battery) of the electronic device 10 are disposed. One or more parts may be disposed, or visually exposed, on the rear surface of the electronic device 10. At least part of a sub-display 190 may be visually exposed through a first rear area 582 of the first back cover 580. Alternatively, one or more parts or sensors may be visually exposed through a second rear area 592 of the second back cover 590. The sensors may include a proximity sensor and/or a rear camera.

Referring to FIG. 2, the hinge cover 530 may be disposed between the first housing structure 510 and the second housing structure 520 and may be configured to hide an internal part (e.g., a hinge structure). The hinge cover 530 may be hidden by part of the first housing structure 510 and part of the second housing structure 520, or may be exposed to the outside, depending on a state (a flat state or a folded state) of the electronic device 10.

For example, when the electronic device 10 is in a flat state as illustrated in FIG. 1, the hinge cover 530 may not be exposed by being hidden by the first housing structure 510 and the second housing structure 520. However, when the electronic device 10 is in a folded state (e.g., a fully folded state) as illustrated in FIG. 2, the hinge cover 530 may be exposed to the outside from between the first housing structure 510 and the second housing structure 520. When the electronic device 10 is in an intermediate state, i.e., when the first housing structure 510 and the second housing structure 520 are folded with a certain angle between the folded state and the flat state, the hinge cover 530 may be partially exposed to the outside from between the first housing structure 510 and the second housing structure 520. However, the exposed area may be smaller than that when the electronic device 10 is in the fully folded state. The hinge cover 530 may include a curved surface.

The display 110 may be disposed in the space formed by the foldable housing 500. For example, the display 110 may be mounted in the recess formed by the foldable housing 500 and may form almost the entire front surface of the electronic device 10.

The front surface of the electronic device 10 includes the display 110, and a partial area of the first housing structure 510 and a partial area of the second housing structure 520 that are adjacent to the display 110. Further, the rear surface of the electronic device 10 includes the first back cover 580, a partial area of the first housing structure 510 that is adjacent to the first back cover 580, the second back cover 590, and a partial area of the second housing structure 520 that is adjacent to the second back cover 590.

At least a portion of the display 110 may be formed into a flat surface or a curved surface. The display 110 includes a folding area 113, a first area 111 disposed on one side of the folding area 113 (on a left side of the folding area 113 illustrated in FIG. 1), and a second area 112 disposed on an opposite side of the folding area 113 (on a right side of the folding area 113 illustrated in FIG. 1).

The areas of the display 110 are illustrative, and the display 110 may be divided into a plurality of areas (e.g., four or more areas, or two areas) depending on the structure or function of the display 110. For example, in FIG. 1, the areas of the display 110 may be divided from each other by the folding area 113 extending parallel to the y axis or by the folding axis (the axis A). However, the display 110 may be divided into areas with respect to another folding area (e.g., a folding area parallel to the x axis) or another folding axis (e.g., a folding axis parallel to the x axis).

The first area 111 and the second area 112 may have shapes that are entirely symmetric to each other with respect to the folding area 113. The second area 112 may include a notch that is cut depending on the presence of the sensor area 524. However, in the other areas, the second area 112 may be symmetrical to the first area 101. That is, the first area 111 and the second area 112 may include symmetrical portions and asymmetrical portions.

When the electronic device 10 is in a flat state (e.g., FIG. 1), the first housing structure 510 and the second housing structure 520 may be arranged to face the same direction while forming an angle of 180 degrees therebetween. That is, the surface of the first area 111 of the display 110 and the surface of the second area 112 thereof face the same direction (e.g., the direction toward the front surface of the electronic device 10) while forming an angle of 180 degrees therebetween. The folding area 113 may form the same plane with the first area 111 and the second area 112.

When the electronic device 10 is in a folded state (e.g., FIG. 2), the first housing structure 510 and the second housing structure 520 may be arranged to face each other. That is, the surface of the first area 111 of the display 110 and the surface of the second area 112 thereof face each other while forming a narrow angle (e.g., an angle between 0 degrees and 10 degrees). At least part of the folding area 113 may be formed to be a curved surface having a predetermined curvature.

When the electronic device 10 is in an intermediate state, the first housing structure 510 and the second housing structure 520 may be arranged to form a certain angle therebetween. The surface of the first area 111 of the display 110 and the surface of the second area 112 thereof may form an angle that is greater than that in the folded state and is smaller than that in the folder state. At least part of the folding area 113 may be formed to be a curved surface having a predetermined curvature, and the curvature may be smaller than that in the folded state.

Figure 3:
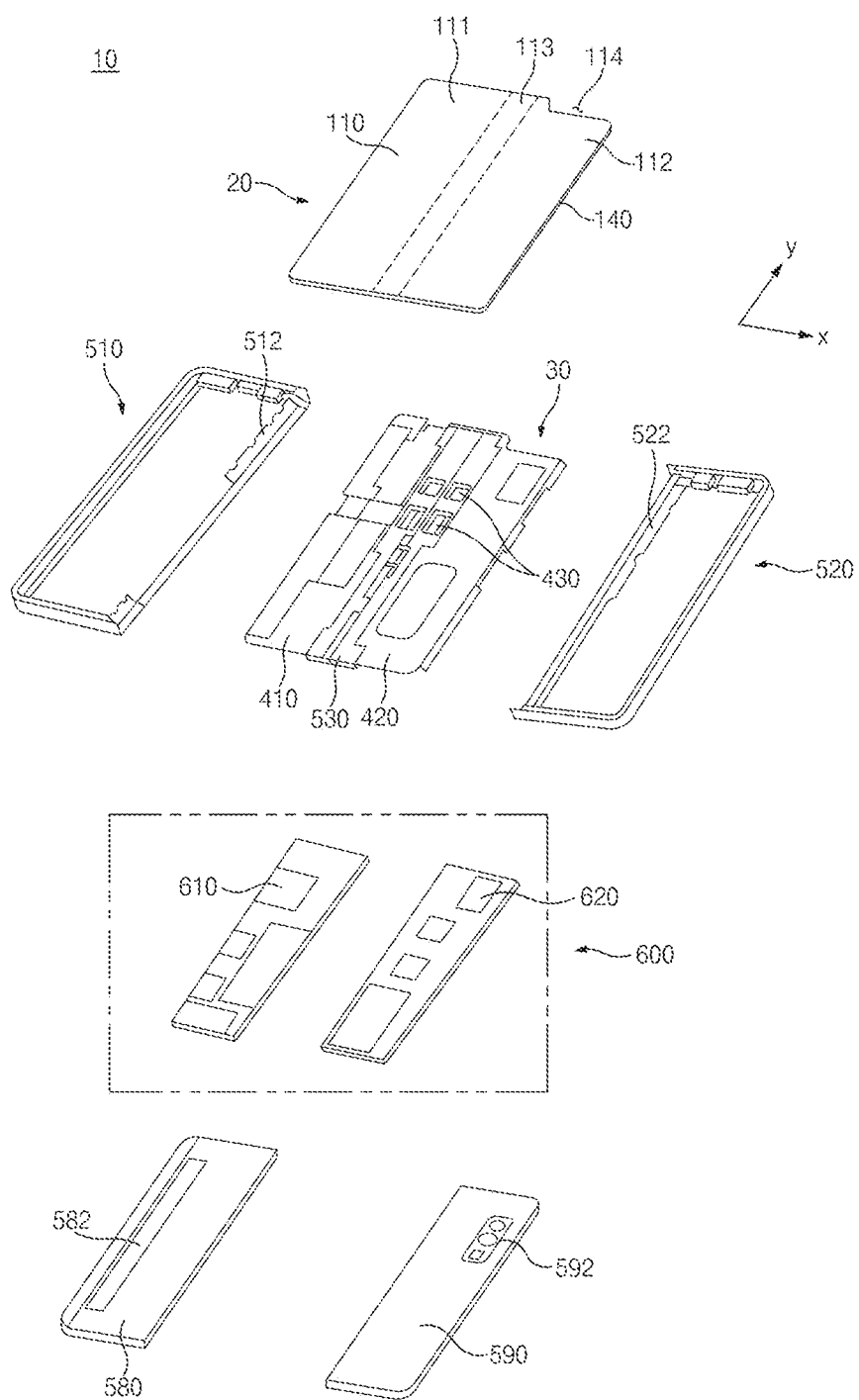
FIG. 3 illustrates an exploded perspective view of an electronic device according to an embodiment.

FIG. 3 illustrates an exploded view of an electronic device according to an embodiment.

Referring to FIG. 3, the electronic device 10 includes a display unit 20, a bracket assembly 30, a PCB 600, the first housing structure 510, the second housing structure 520, the first back cover 580, and the second back cover 590. The display unit 20 may also be referred to as a display module or a display assembly.

The display unit 20 include a display 110 and one or more plates or layers 140 on which the display 110 is mounted. The plates 140 may be disposed between the display 110 and the bracket assembly 30. The display 110 may be disposed on at least part of one surface (e.g., an upper surface with respect to FIG. 3) of the plates 140. The plates 140 may be formed in a shape corresponding to the display 110. For example, partial areas of the plates 140 may be formed in a shape corresponding to a notch 114 of the display 110.

The bracket assembly 30 includes a first bracket 410, a second bracket 420, a hinge structure disposed between the first bracket 410 and the second bracket 420, the hinge cover 530 that covers the hinge structure when viewed from the outside, and wiring members 430 (e.g., flexible printed circuits (FPCs)) that traverse the first bracket 410 and the second bracket 420.

The bracket assembly 30 is disposed between the plates 140 and the PCB 600. The first bracket 410 is disposed between the first area 111 of the display 110 and a first PCB 610, and the second bracket 420 is disposed between the second area 112 of the display 110 and a second PCB 620.

The wiring members 430 and at least part of the hinge structure may be disposed inside the bracket assembly 30. The wiring members 430 may be arranged in a direction (e.g., the x-axis direction) across the first bracket 410 and the second bracket 420. The wiring members 430 may be arranged in a direction (e.g., the x-axis direction) that is perpendicular to a folding axis (e.g., the y-axis or the folding axis A of FIG. 1) of the folding area 113 of the electronic device 10.

The PCB 600 includes the first PCB 610 disposed on one side of the first bracket 410 and the second PCB 620 disposed on one side of the second bracket 420. The first PCB 610 and the second PCB 620 may be disposed in a space formed by the bracket assembly 30, the first housing structure 510, the second housing structure 520, the first back cover 580, and the second back cover 590. Parts for implementing various functions of the electronic device 10 may be mounted on the first PCB 610 and the second PCB 620.

The first housing structure 510 and the second housing structure 520 may be coupled to opposite sides of the bracket assembly 30 having the display unit 20 coupled thereto. As will be described below, the first housing structure 510 and the second housing structure 520 may be coupled to the bracket assembly 30 by sliding on the opposite sides of the bracket assembly 30.

The first housing structure 510 includes a first rotation support surface 512, and the second housing structure 520 includes a second rotation support surface 522 corresponding to the first rotation support surface 512. The first rotation support surface 512 and the second rotation support surface 522 may include a curved surface corresponding to the curved surface included in the hinge cover 530.

When the electronic device 10 is in the flat state (e.g., as illustrated in FIG. 1), the first rotation support surface 512 and the second rotation support surface 522 may cover the hinge cover 530 such that the hinge cover 530 is not exposed, or is minimally exposed, on the rear surface of the electronic device 10. When the electronic device 10 is in a folded state (e.g., as illustrated in FIG. 2), the first rotation support surface 512 and the second rotation support surface 522 may rotate along the curved surfaces of the hinge cover 530 such that the hinge cover 530 is maximally exposed on the rear surface of the electronic device 10.

Figure 4:
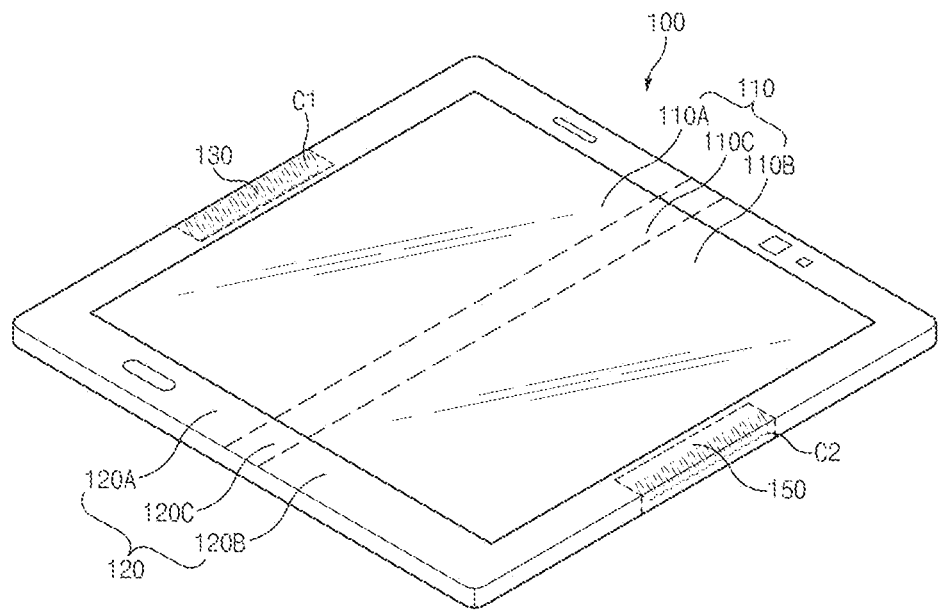
FIG. 4 illustrates a front side and a rear side of a foldable electronic device according to an embodiment.
Figure 4:
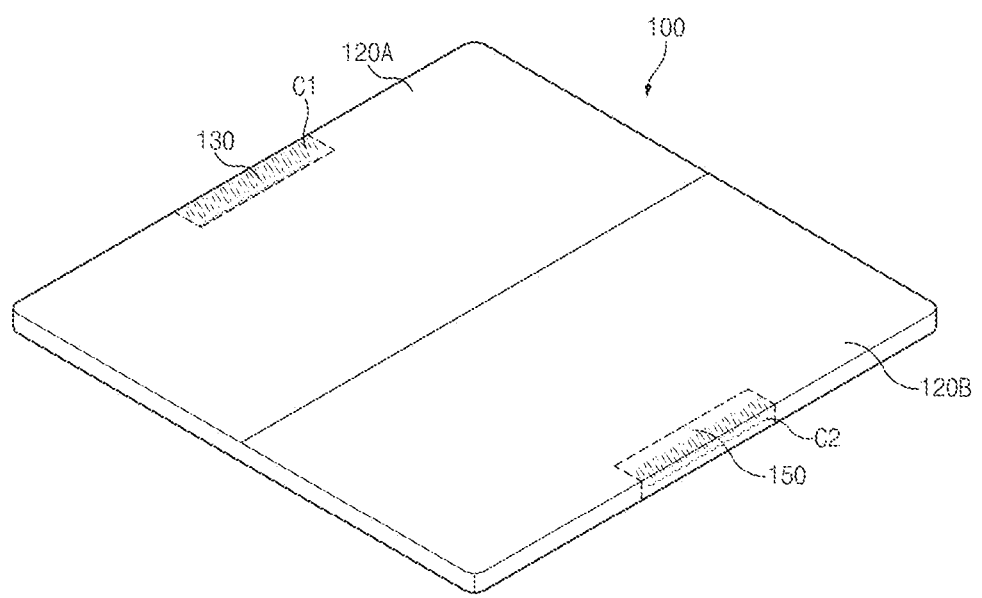

FIG. 4 illustrates a front side and a rear side of a foldable electronic device according to an embodiment.

Referring to FIG. 4, a foldable electronic device 100 includes a display 110 and a housing 120.

The display 110 includes a first display area 110A and a second display area 110B continuous from one side of the first display area 110A. For example, at least part (e.g., a rear surface of the display) of the first display area 110A may be coupled to one side (e.g., a first housing structure 120A) of the housing 120, and the remaining parts (e.g., a screen display area) of the first display area 110A may be exposed. For example, at least a part (e.g., a rear surface) of the second display area 110B may be coupled to an opposite side (e.g., a second housing structure 120B) of the housing 120, and the remaining parts (e.g., a screen display area) of the second display area 110B may be exposed. A segmenting area 110C may be located between the first display area 110A and the second display area 110B (e.g., between a right edge of the first display area 110A and a left edge of the second display area 110B with respect to the illustrated drawing). For example, when an arrangement state is changed into a folded state in which the first display area 110A and the second display area 110B are arranged in different directions or a flat state in which the first display area 110A and the second display area 110B are arranged in the same direction, the segmenting area 110C may include a predetermined area located between the first display area 110A and the second display area 110B.

The housing 120 includes the first housing structure 120A, the second housing structure 120B, and a hinge structure 120C. A first magnetic field area 130 is formed at an edge of the first housing structure 120A. A first receiving coil C1 is disposed in the first magnetic field area 130. A separate metal piece may be inserted into the first receiving coil C1 to increase the intensity of a magnetic field. A second magnetic field area 150 is formed at an edge of the second housing structure 120B. A second receiving coil C2 is disposed in the second magnetic field area 150. Alternatively, the second receiving coil C2 in the second magnetic field area 150 may be excluded from the second housing structure 120B, and only a plurality of slits may be formed in the second magnetic field area 150. For example, the hinge structure 120C may be located between the first housing structure 120A and the second housing structure 120B (e.g., between a right edge of the first housing structure 120A and a left edge of the second housing structure 120B with respect to the illustrated drawing). The hinge structure 120C may be exposed to the outside from between the first housing structure 120A and the second housing structure 120B depending on a folded state of the first display area 110A and the second display area 110B. The hinge structure 120C may be hidden by connecting portions of the first housing structure 120A and the second housing structure 120B depending on a flat state of the first display area 110A and the second display area 110B. At least part of the housing 120 may be formed of a metallic material or a non-metallic material and may have a predetermined stiffness to support the display 110. Electronic elements that are related to operating the display 110 (e.g., a PCB, a battery, etc.) may be disposed in the interior of the housing 120 having a form that is at least partially empty.

Figure 5:
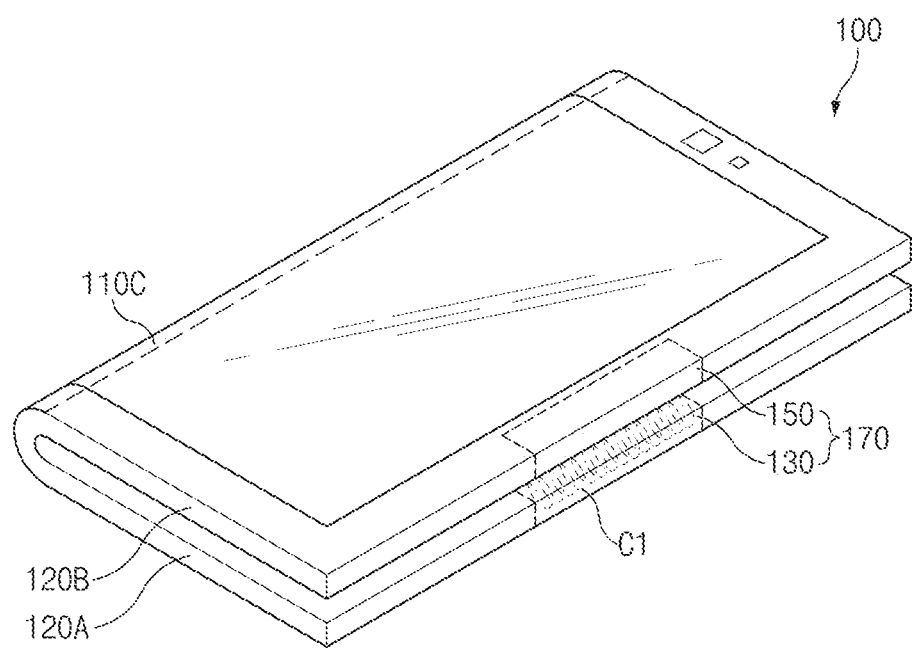
FIG. 5 illustrates a folded state of an electronic device according to an embodiment.

FIG. 5 illustrates a folded state of an electronic device according to an embodiment.

Referring to FIG. 5, opposite display areas (e.g., the first display area 110A and the second display area 110B of FIG. 4) of the foldable electronic device 100 may be arranged in different directions depending on a folded state of the display 110. In the folded state, when the opposite display areas are arranged in the different directions, the first magnetic field area 130 of the first housing structure 120A and the second magnetic field area 150 of the second housing structure 120B are arranged side by side.

As a result, a third magnetic field area 170 is formed on the opposite side to the segmenting area 110C in the foldable electronic device 100 in the folded state. The third magnetic field area 170 may represent the first magnetic field area 130 and the second magnetic field area 150 being superimposed on each other. For example, in the third magnetic field area 170, a magnetic field generated from the first receiving coil C1 may pass through both the first magnetic field area 130 and the second magnetic field area 150.

Figure 6A:
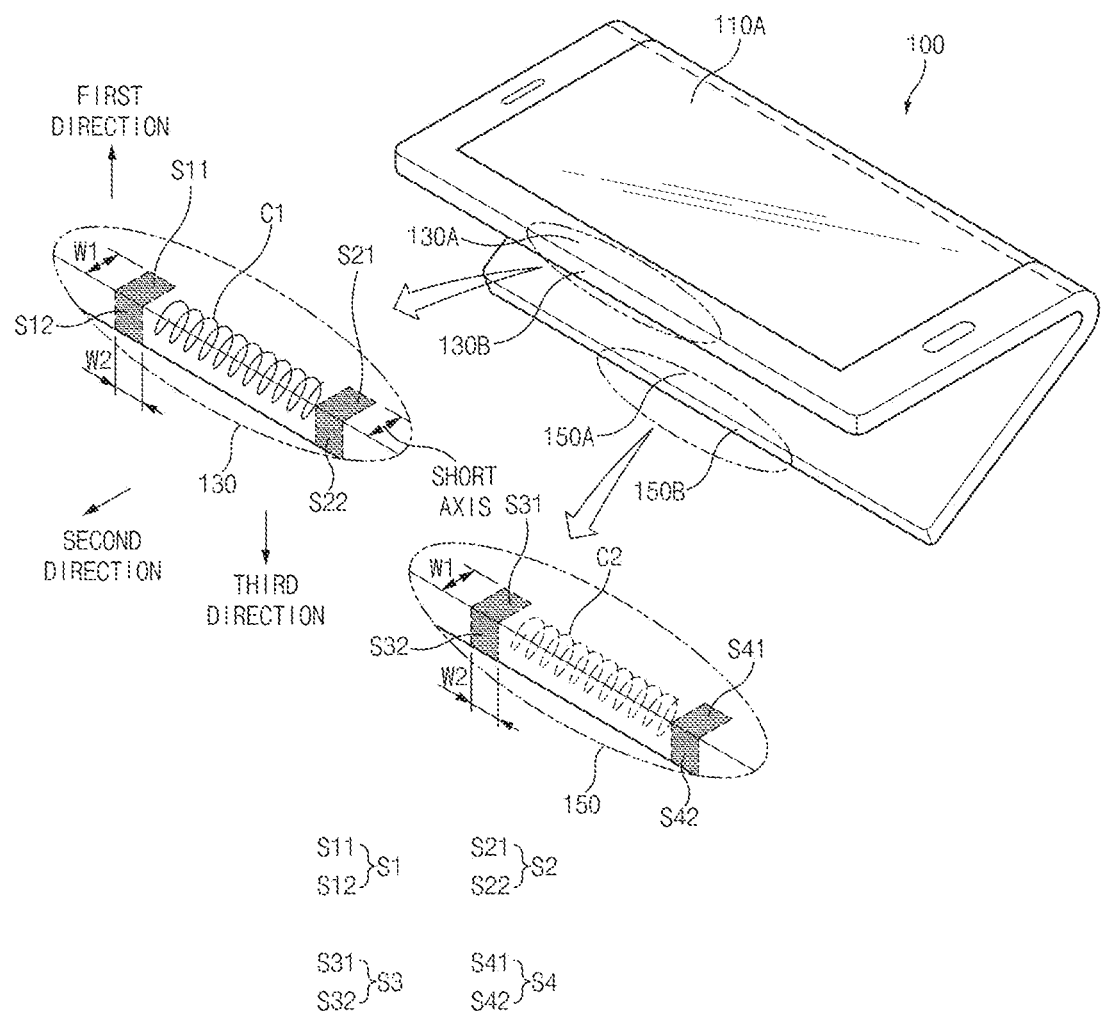
FIG. 6A illustrates a top perspective view of an electronic device in a folded state according to an embodiment.
Figure 6B:
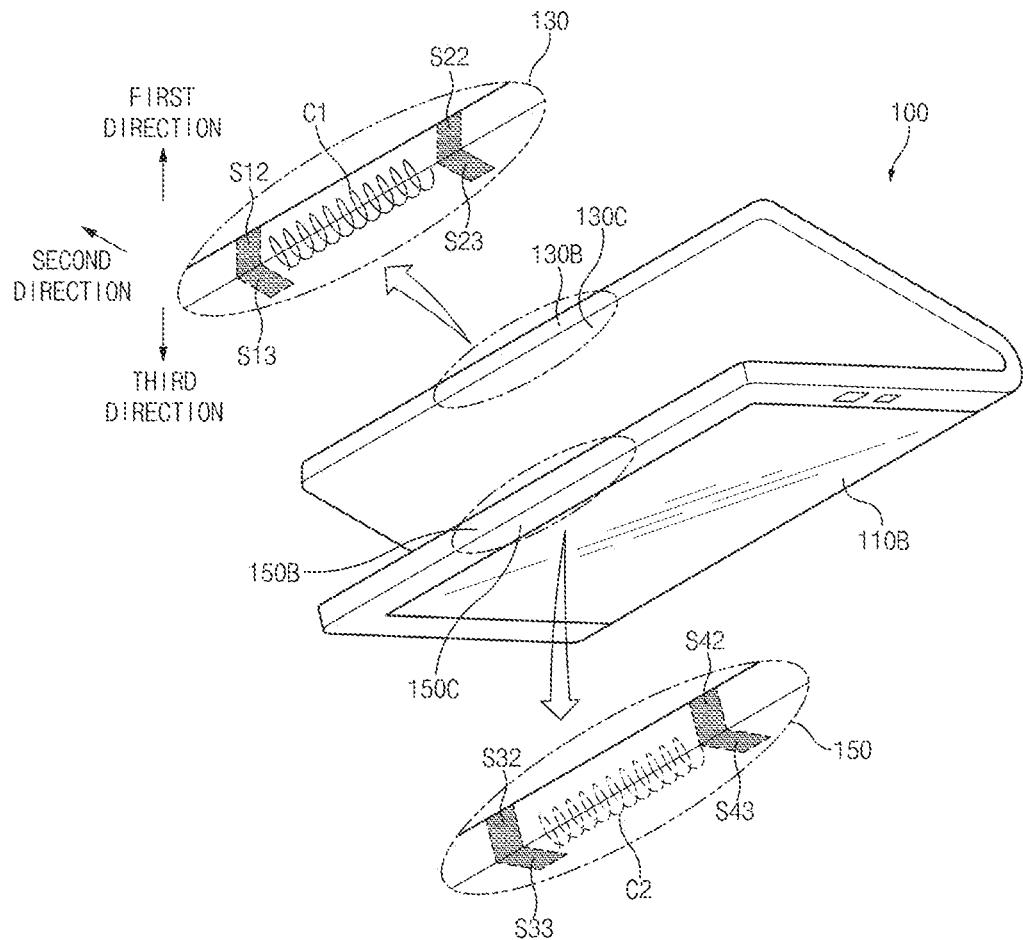
FIG. 6B illustrates a bottom perspective view of an electronic device in a folded state according to an embodiment.

FIG. 6A illustrates a top perspective view of an electronic device in a folded state according to an embodiment. FIG. 6B illustrates a bottom perspective view of an electronic device in a folded state according to an embodiment.

Referring to FIGS. 6A and 6B, a first magnetic field area 130 includes a first front surface 130A, a first side surface 130B, and a first rear surface 130C. The first front surface 130A may be arranged in a first direction in which the screen display area of the first display area 110A is exposed. The first side surface 130B may be arranged in a second direction perpendicular to the first direction. The first rear surface 130C may be arranged in a third direction opposite to the first direction. The first receiving coil C1 may be disposed between the first front surface 130A, the first side surface 130B, and the first rear surface 130C. The first receiving coil C1 may include, for example, at least one of a solenoid coil, a coil for magnetic secure transmission (MST), or a coil for near field communication (NFC).

A first slit S1 is be formed in the first magnetic field area 130 adjacent to a first end of the first receiving coil C1 (e.g., a left end of the first receiving coil C1). The first slit S1 includes at least one of a first opening S11, a second opening S12, or a third opening S13. The first opening S11 may be formed on the first front surface 130A adjacent to the first end of the first receiving coil C1. A first width W1 of the first opening S11 may be greater than or equal to a height of a short axis of the first receiving coil C1. The second opening S12 may be formed on the first side surface 130B adjacent to the first end of the first receiving coil C1. A second width W2 of the second opening S12 may be greater than or equal to a set length (e.g., 1 mm) The third opening S13 may be formed on the first rear surface 130C adjacent to the first end of the first receiving coil C1. Further, the third opening S13 may have a width equal to the first width W1 of the first opening S11.

A second slit S2 may be formed in the first magnetic field area 130 adjacent to as second end (or an opposite end) of the first receiving coil C1 (e.g., a right end of the first receiving coil C1). The second slit S2 may include at least one of a fourth opening S21, a fifth opening S22, or a sixth opening S23. The fourth opening S21 may be formed on the first front surface 130A adjacent to the second end of the first receiving coil C1. Further, the fourth opening S21 may have a width equal to the first width W1 of the first opening S11. The fifth opening S22 may be formed on the first side surface 130B adjacent to the second end of the first receiving coil C1. Further, the fifth opening S22 may have a width equal to the second width W2 of the second opening S12. The sixth opening S23 may be formed on the first rear surface 130C adjacent to the second end of the first receiving coil C1. Further, the sixth opening S23 may have a width equal to the first width W1 of the first opening S11. The second slit S2 may correspond to the first slit S1 with the first receiving coil C1 therebetween.

The second magnetic field area 150 includes a second front surface 150A, a second side surface 150B, and a second rear surface 150C. The second front surface 150A may be arranged in the first direction opposite to the screen display area of the second display area 110B. The second side surface 150B may be arranged in the second direction perpendicular to the first direction. The second rear surface 150C may be arranged in the third direction opposite to the first direction. The second receiving coil C2 may be disposed between the second front surface 150A, the second side surface 150B, and the second rear surface 150C. When the first display area 110A and the second display area 110B are folded to face different directions, the position of the second receiving coil C2 may correspond to the position of the first receiving coil C1. Further, when the first receiving coil C1 is adjacent to the second receiving coil C2, the second receiving coil C2 may form a magnetic field having polarities in the same direction as the first receiving coil C1.

A third slit S3 may be formed in the second magnetic field area 150 adjacent to a first end of the second receiving coil C2 (e.g., a left end of the second receiving coil C2). The third slit S3 may include at least one of a seventh opening S31, an eighth opening S32, or a ninth opening S33. The seventh opening S31 may be formed on the second front surface 150A adjacent to the first end of the second receiving coil C2. The seventh opening S31 may have a first width W1 that is equal to the first width W1 of the first opening S11. The eighth opening S32 may be formed on the second side surface 150B adjacent to the first end of the second receiving coil C2. The eighth opening S32 may have a second width W2 that is equal to the second width W2 of the second opening S12. The ninth opening S33 may be formed on the second rear surface 150C adjacent to the first end of the second receiving coil C2. The ninth opening S33 may have a width equal to the first width W1 of the seventh opening S31.

A fourth slit S4 may be formed in the second magnetic field area 150 adjacent to a second end (or an opposite end) of the second receiving coil C2 (e.g., a right end of the second receiving coil C2). The fourth slit S4 may include at least one of a tenth opening S41, an eleventh opening S42, or a twelfth opening S43. The tenth opening S41 may be formed on the second front surface 150A adjacent to the second end of the second receiving coil C2. The tenth opening S41 may have a width equal to the first width W1 of the seventh opening S31. The eleventh opening S42 may be formed on the second side surface 150B adjacent to the second end of the second receiving coil C2. The eleventh opening S42 may have a width equal to the second width W2 of the eighth opening S32. The twelfth opening S43 may be formed on the second rear surface 150C adjacent to the second end of the second receiving coil C2. The twelfth opening S43 may have a width equal to the first width W1 of the seventh opening S31. When in a flat state in which the first display area 110A and the second display area 110B are arranged in the same direction, the fourth slit S4 may correspond to the third slit S3 with the second receiving coil C2 therebetween. When in a folded state in which the first display area 110A and the second display area 110B are arranged in different directions, the fourth slit S4 may correspond to the third slit S3 with the first receiving coil C1 therebetween.

At least a part of the opening-formed portions of each of the first slit S1, the second slit S2, the third slit S3, and the fourth slit S4 may be filled with a non-conductive material.

Figure 7:
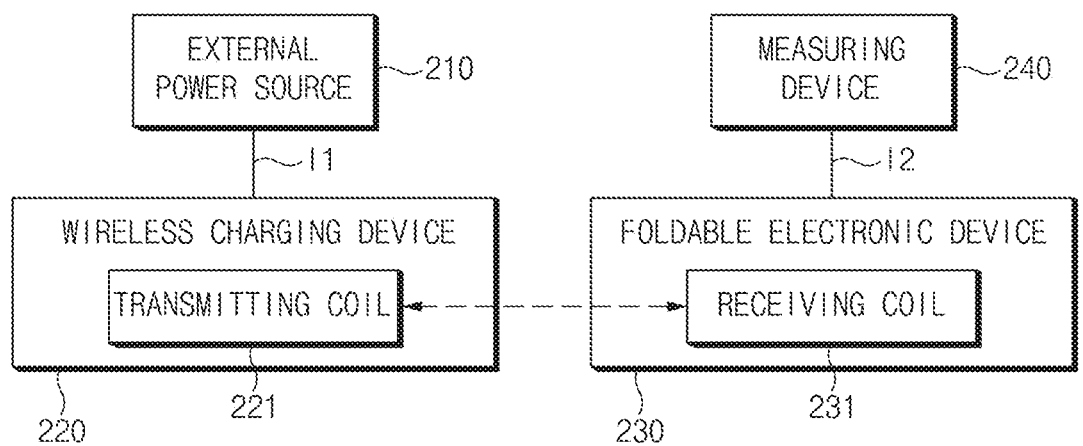
FIG. 7 illustrates an electric power transmission/reception relationship between a foldable electronic device and a wireless charging device according to an embodiment.

FIG. 7 illustrates an electric power transmission/reception relationship between a foldable electronic device and a wireless charging device according to an embodiment.

Referring to FIG. 7, a foldable electronic device 230 may be positioned near a wireless charging device 220. The foldable electronic device 230 may receive electric power from the wireless charging device 220. The wireless charging device 220 may generate a magnetic field of a transmitting coil 221 (e.g., a solenoid coil) by using electric power supplied from an external power source 210. The electric power supplied from the external power source 210 may include an electric current I1 with a first magnitude. In the foldable electronic device 230, an induced current may be generated in a receiving coil 231 (e.g., a solenoid coil) by the magnetic field of the transmitting coil 221. The induced current may include an electric current I2 with a second magnitude. The electric current I2 with the second magnitude that is measured by a measurement device 240 (e.g., a galvanometer) may be differently measured depending on the structures of slits (e.g., the first to fourth slits S1 to S4 of FIGS. 6A and 6B).

Figure 8A:
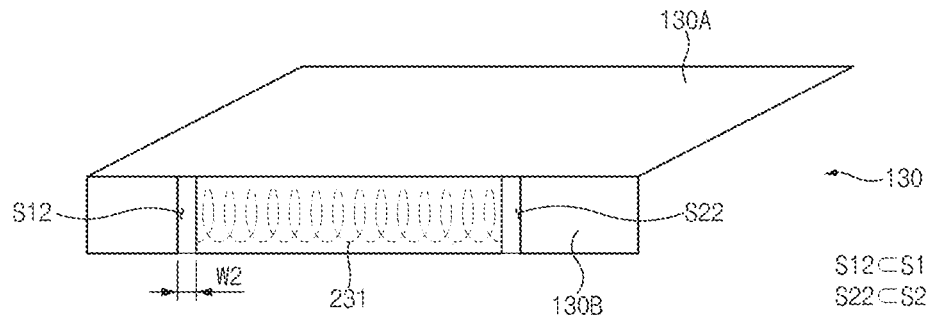
FIG. 8A illustrates a first slit structure formed around a receiving coil of a foldable electronic device according to an embodiment.
Figure 8B:
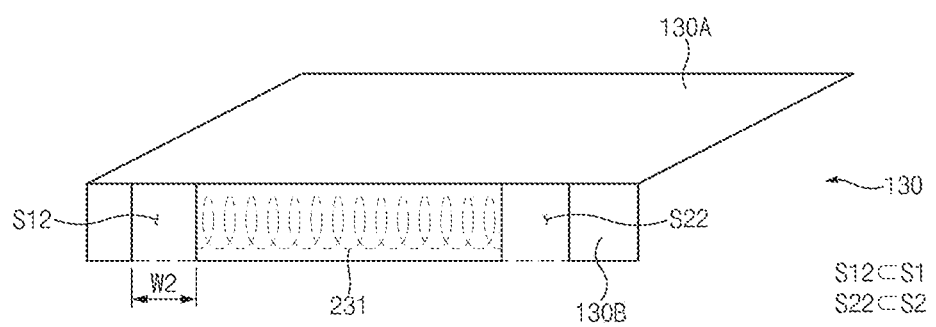
FIG. 8B illustrates a second slit structure formed around a receiving coil of a foldable electronic device according to an embodiment.
Figure 8C:
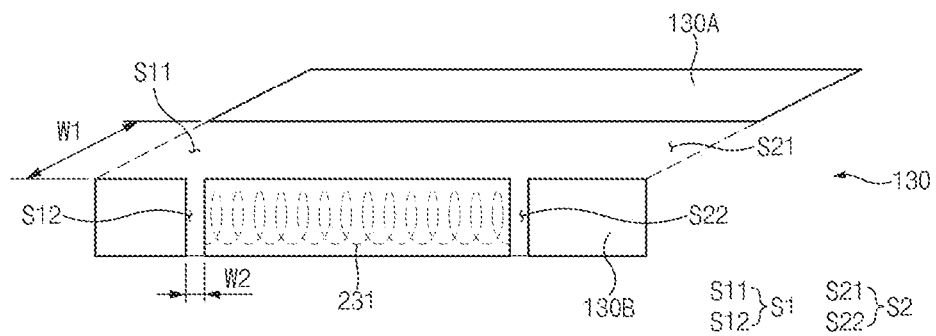
FIG. 8C illustrates a third slit structure formed around a receiving coil of a foldable electronic device according to an embodiment.
Figure 8D:
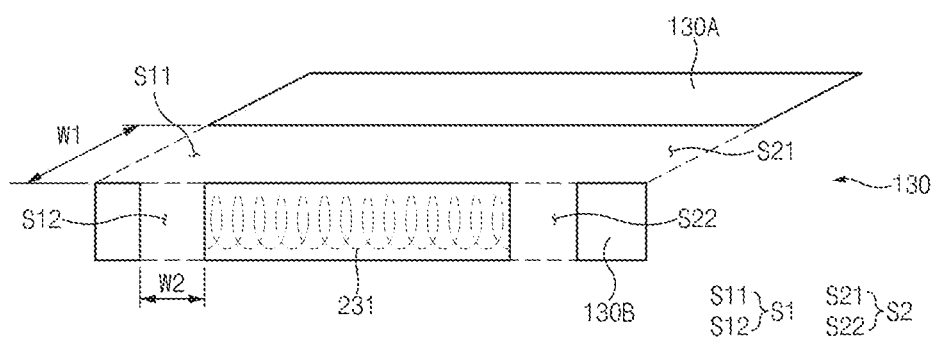
FIG. 8D illustrates a fourth slit structure formed around a receiving coil of a foldable electronic device according to an embodiment.
Figure 8E:
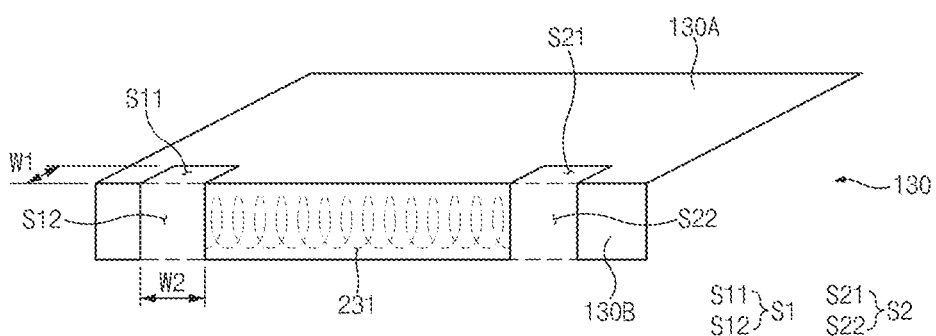
FIG. 8E illustrates a fifth slit structure formed around a receiving coil of a foldable electronic device according to an embodiment.

FIG. 8A illustrates a first slit structure formed around a receiving coil of a foldable electronic device according to an embodiment. FIG. 8B illustrates a second slit structure formed around a receiving coil of a foldable electronic device according to an embodiment. FIG. 8C illustrates a third slit structure formed around a receiving coil of a foldable electronic device according to an embodiment. FIG. 8D illustrates a fourth slit structure formed around a receiving coil of a foldable electronic device according to an embodiment. FIG. 8E illustrates a fifth slit structure formed around a receiving coil of a foldable electronic device according to an embodiment.

Using the slit structures illustrated in FIGS. 8A to 8E, the results of Table 1 below may be derived based on the electric power transmission/reception relationship of FIG. 7.

TABLE 1

| Test 1 | 9 W | | | | | 5 W | | | | |
| --- | --- | --- | --- | --- | --- | --- | --- | --- | --- | --- |
| | I in (mA) | V in (V) | I out (mA) | V out (V) | Efficiency (%) | I in (mA) | V in (V) | I out (mA) | V out (V) | Efficiency (%) |
| FIG. 8A | Non-measurable | | | | | Non-measurable | | | | |
| FIG. 8B | Non-measurable | | | | | Non-measurable | | | | |
| FIG. 8C | 1,792 | 9 | 1,000 | 9 | 55.8 | 1,803 | 5 | 1,000 | 5 | 55.46 |
| FIG. 8D | 1,707 | 9 | 1,000 | 9 | 58.58 | 1,729 | 5 | 1,000 | 5 | 57.84 |
| FIG. 8E | 1,702 | 9 | 1,000 | 9 | 58.75 | 1,730 | 5 | 1,000 | 5 | 57.8 |

Referring to FIG. 8A, the receiving coil 231 is disposed in the first magnetic field area 130 of the housing. The first slit S1 is formed in the first magnetic field area 130 adjacent to a first end of the receiving coil 231 (e.g., a left end of the receiving coil 231). The first slit S1 includes the second opening S12. The second opening S12 is formed on the first side surface 130B adjacent to the first end of the receiving coil 231. The second width W2 of the second opening S12 may have a set length (e.g., 1 mm).

The second slit S2 is formed in the first magnetic field area 130 adjacent to a second end (e.g., an opposite end) of the receiving coil 231 (e.g., a right end of the receiving coil 231). The second slit S2 includes the fifth opening S22. The fifth opening S22 is formed on the first side surface 130B adjacent to the second end of the receiving coil 231. The fifth opening S22 may have a width (e.g., 1 mm) that is equal to the second width W2 of the second opening S12.

As shown in Table 1 above, according to the first slit structure, an electric current is non-measurable when 9 W (or 5 W) of electric power is supplied from the wireless charging device 220 to the foldable electronic device 230.

Referring to FIG. 8B, similar to FIG. 8A, the first slit S1 and the second slit S2 are formed in the first magnetic field area 130. The first slit S1 is formed in the first magnetic field area 130 adjacent to the first end of the receiving coil 231. The first slit S1 includes the second opening S12. The second width W2 of the second opening S12 may have a set length (e.g., 10 mm).

The second slit S2 is formed in the first magnetic field area 130 adjacent to the second end of the receiving coil 231 (e.g., the right end of the receiving coil 231). The second slit S2 includes the fifth opening S22. The fifth opening S22 may have a width (e.g., 10 mm) that is equal to the second width W2 of the second opening S12.

As shown in Table 1 above, according to the second slit structure, an electric current is non-measurable when 9 W (or 5 W) of electric power is supplied from the wireless charging device 220 to the foldable electronic device 230.

Referring to FIG. 8C, similar to FIG. 8A, the first slit S1 and the second slit S2 are formed in the first magnetic field area 130. The first slit S1 is formed in the first magnetic field area 130 adjacent to the first end of the receiving coil 231. The first slit S1 includes the first opening S11 and the second opening S12. The first opening S11 is formed on the first front surface 130A adjacent to the first end of the receiving coil 231. The first width W1 of the first opening S11 may be greater than a height of the short axis of the receiving coil 231. The second opening S12 is formed on the first side surface 130B adjacent to the first end of the receiving coil 231. The second width W2 of the second opening S12 may have a set length (e.g., 1 mm).

The second slit S2 is formed in the first magnetic field area 130 adjacent to the second end of the receiving coil 231. The second slit S2 includes the fourth opening S21 and the fifth opening S22. The fourth opening S21 extends from the first front surface 130A adjacent to the second end of the receiving coil 231 to the first opening S11. The fourth opening S21 may have a width that is equal to the first width W1 of the first opening S11 (e.g., greater than the height of the short axis of the receiving coil 231). The fifth opening S22 is formed on the first side surface 130B adjacent to the second end of the receiving coil 231. The fifth opening S22 may have a width (e.g., 1 mm) that is equal to the second width W2 of the second opening S12.

As shown in Table 1 above, according to the third slit structure, an electric current with a second magnitude (e.g., I in=1,000 mA) is measured when 9 W of electric power (I in=1,792 mA) is supplied from the wireless charging device 220 to the foldable electronic device 230. The electric current with the second magnitude (e.g., I in=1,000 mA) has an efficiency of 55.8%, compared to the 9 W of electric power (I in=1,792 mA) that is supplied from the wireless charging device 220 to the foldable electronic device 230. An electric current with a second magnitude (e.g., I in=1,000 mA) is measured when 5 W of electric power (I in=1,803 mA) is supplied from the wireless charging device 220 to the foldable electronic device 230. The electric current with the second magnitude (e.g., I in=1,000 mA) has an efficiency of 55.46%, compared to the 5 W of electric power (I in=1,803 mA) that is supplied from the wireless charging device 220 to the foldable electronic device 230.

Referring to FIG. 8D, the first slit S1 and the second slit S2 are formed in the first magnetic field area 130. The first slit S1 is formed in the first magnetic field area 130 adjacent to the first end of the receiving coil 231. The first slit S1 includes the first opening S11 and the second opening S12. The first opening S11 is formed on the first front surface 130A adjacent to the first end of the receiving coil 231. The first width W1 of the first opening S11 may be formed to be greater than the height of the short axis of the receiving coil 231. The second opening S12 is formed on the first side surface 130B adjacent to the first end of the receiving coil 231. The second width W2 of the second opening S12 may have a set length (e.g., 10 mm).

The second slit S2 is formed in the first magnetic field area 130 adjacent to the second end of the receiving coil 231. The second slit S2 includes the fourth opening S21 and the fifth opening S22. The fourth opening S21 extends from the first front surface 130A adjacent to the second end of the receiving coil 231 to the first opening S11. The fourth opening S21 has a width that is equal to the first width W1 of the first opening S11 (e.g., greater than the height of the short axis of the receiving coil 231). The fifth opening S22 is formed on the first side surface 130B adjacent to the second end of the receiving coil 231. The fifth opening S22 has a width (e.g., 10 mm) that is equal to the second width W2 of the second opening S12.

As shown in Table 1 above, according to the fourth slit structure, an electric current with a second magnitude (e.g., I in=1,000 mA) is measured when 9 W of electric power (I in=1,707 mA) is supplied from the wireless charging device 220 to the foldable electronic device 230. The electric current with the second magnitude (e.g., I in=1,000 mA) has an efficiency of 58.58%, compared to the 9 W of electric power (I in=1,707 mA) that is supplied from the wireless charging device 220 to the foldable electronic device 230. An electric current with a second magnitude (e.g., I in=1,000 mA) is measured when 5 W of electric power (I in=1,729 mA) is supplied from the wireless charging device 220 to the foldable electronic device 230. The electric current with the second magnitude (e.g., I in=1,000 mA) has an efficiency of 57.84%, compared to the 5 W of electric power (I in=1,729 mA) that is supplied from the wireless charging device 220 to the foldable electronic device 230.

Referring to FIG. 8E, the first slit S1 and the second slit S2 are formed in the first magnetic field area 130. The first slit S1 is formed in the first magnetic field area 130 adjacent to the first end of the receiving coil 231. The first slit S1 includes the first opening S11 and the second opening S12. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm).

The second slit S2 is formed in the first magnetic field area 130 adjacent to the second end of the receiving coil 231. The second slit S2 includes the fourth opening S21 and the fifth opening S22. The fourth opening S21 is formed on the first front surface 130A adjacent to the second end of the receiving coil 231. The fourth opening S21 may have a width that is equal to the first width W1 of the first opening S11 (e.g., equal to the height of the short axis of the receiving coil 231). The fifth opening S22 is formed on the first side surface 130B adjacent to the second end of the receiving coil 231. The fifth opening S22 may have a width (e.g., 10 mm) that is equal to the second width W2 of the second opening S12.

As shown in Table 1 above, according to the fifth slit structure, an electric current with a second magnitude (e.g., I in=1,000 mA) is measured when 9 W of electric power (I in=1,702 mA) is supplied from the wireless charging device 220 to the foldable electronic device 230. The electric current with the second magnitude (e.g., I in=1,000 mA) has an efficiency of 58.75%, compared to the 9 W of electric power (I in=1,702 mA) that is supplied from the wireless charging device 220 to the foldable electronic device 230. An electric current with a second magnitude (e.g., I in=1,000 mA) is measured when 5 W of electric power (I in=1,730 mA) is supplied from the wireless charging device 220 to the foldable electronic device 230. The electric current with the second magnitude (e.g., I in=1,000 mA) has an efficiency of 57.8%, compared to the 5 W of electric power (I in=1,730 mA) that is supplied from the wireless charging device 220 to the foldable electronic device 230.

Figure 9A:
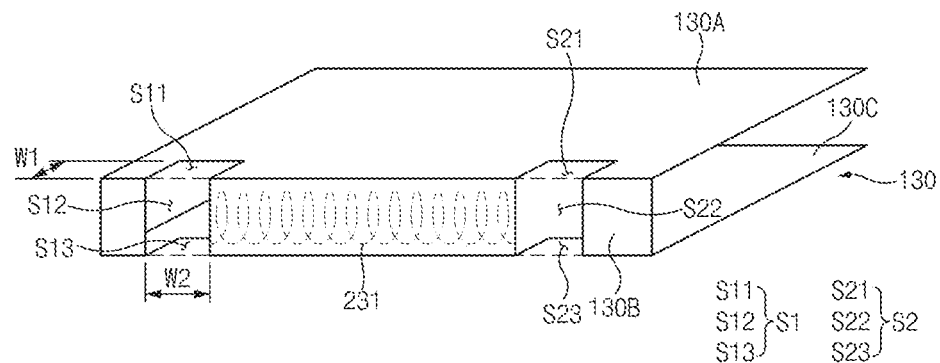
FIG. 9A illustrates a sixth slit structure formed around a receiving coil of a foldable electronic device according to an embodiment.
Figure 9B:
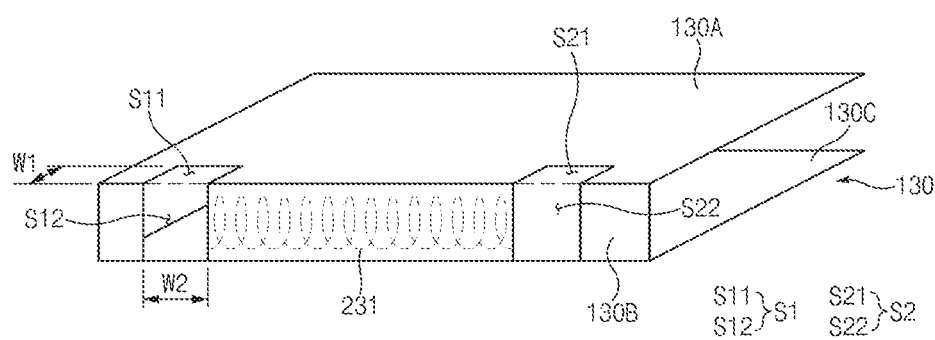
FIG. 9B illustrates a seventh slit structure formed around a receiving coil of a foldable electronic device according to an embodiment.

FIG. 9A illustrates a sixth slit structure formed around a receiving coil of a foldable electronic device according to an embodiment. FIG. 9B illustrates a seventh slit structure formed around a receiving coil of a foldable electronic device according to an embodiment.

Using the slit structures in FIGS. 9A and 9B, the results as shown in Table 2 below may be derived based on the electric power transmission/reception relationship of FIG. 7.

TABLE 2

| Test 2 | 9 W | | | | | 5 W | | | | |
|---|---|---|---|---|---|---|---|---|---|---|
| | I in (mA) | V in (V) | I out (mA) | V out (V) | Efficiency (%) | I in (mA) | V in (V) | I out (mA) | V out (V) | Efficiency (%) |
| FIG. 9A | 1,707 | 9 | 1,000 | 9 | 58.58 | 1,729 | 5 | 1,000 | 5 | 57.84 |
| FIG. 9B | | | Non-measurable | | | | | Non-measurable | | |

Referring to FIG. 9A, the receiving coil 231 is disposed in the first magnetic field area 130 of the housing. The first slit S1 is formed in the first magnetic field area 130 adjacent to the first end of the receiving coil 231 (e.g., the left end of the receiving coil 231). The first slit S1 includes the first opening S11, the second opening S12, and the third opening S13. The first opening S11 is formed on the first front surface 130A adjacent to the first end of the receiving coil 231. The first width W1 of the first opening S11 may be formed to be equal to the height of the short axis (e.g., the short axis of FIG. 6A) of the receiving coil 231. The second opening S12 is formed on the first side surface 130B adjacent to the first end of the receiving coil 231. The second width W2 of the second opening S12 may have a set length (e.g., 10 mm) The third opening S13 is formed on the first rear surface 130C adjacent to the first end of the receiving coil 231. The third opening S13 may have a width that is equal to the first width W1 of the first opening S11 (e.g., equal to the height of the short axis of the receiving coil 231).

The second slit S2 is formed in the first magnetic field area 130 adjacent to the second end of the receiving coil 231 (e.g., the right end of the receiving coil 231). The second slit S2 includes the fourth opening S21, the fifth opening S22, and the sixth opening S23. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width that is equal to the first width W1 of the first opening S11.

As shown in Table 2 above, according to the sixth slit structure, an electric current with a second magnitude (e.g., I in=1,000 mA) is measured when 9 W of electric power (I in=1,707 mA) is supplied from the wireless charging device 220 to the foldable electronic device 230. The electric current with the second magnitude (e.g., I in=1,000 mA) has an efficiency of 58.58%, compared to the 9 W of electric power (I in=1,707 mA) that is supplied from the wireless charging device 220 to the foldable electronic device 230. An electric current with a second magnitude (e.g., I in=1,000 mA) is measured when 5 W of electric power (I in=1,729 mA) is supplied from the wireless charging device 220 to the foldable electronic device 230. The electric current with the second magnitude (e.g., I in=1,000 mA) has an efficiency of 57.84%, compared to the 5 W of electric power (I in=1,729 mA) that is supplied from the wireless charging device 220 to the foldable electronic device 230.

Referring to FIG. 9B, the first slit S1 and the second slit S2 are formed in the first magnetic field area 130. The first slit S1 is formed in the first magnetic field area 130 adjacent to the first end of the receiving coil 231. The first slit S1 includes the first opening S11 and the second opening S12. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm).

The second slit S2 is formed in the first magnetic field area 130 adjacent to the second end of the receiving coil 231. The second slit S2 includes the fourth opening S21 and the fifth opening S22. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12.

As shown in Table 2 above, according to the seventh slit structure, an electric current with a second magnitude is non-measurable when 9 W (or 5 W) of electric power is supplied from the wireless charging device 220 to the foldable electronic device 230.

Figure 10A:
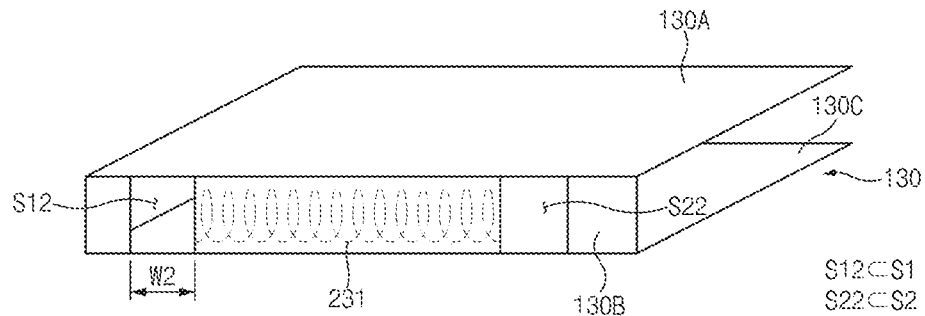
FIG. 10A illustrates an eighth slit structure formed around a receiving coil of a foldable electronic device according to an embodiment.
Figure 10B:
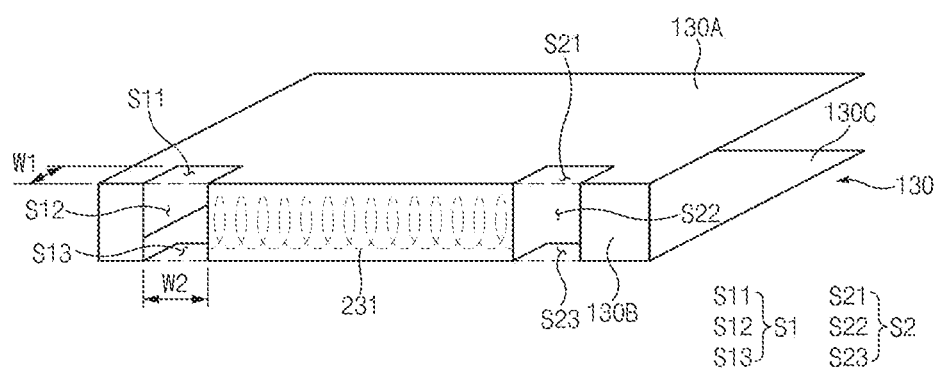
FIG. 10B illustrates a ninth slit structure formed around a receiving coil of a foldable electronic device according to an embodiment.
Figure 10C:
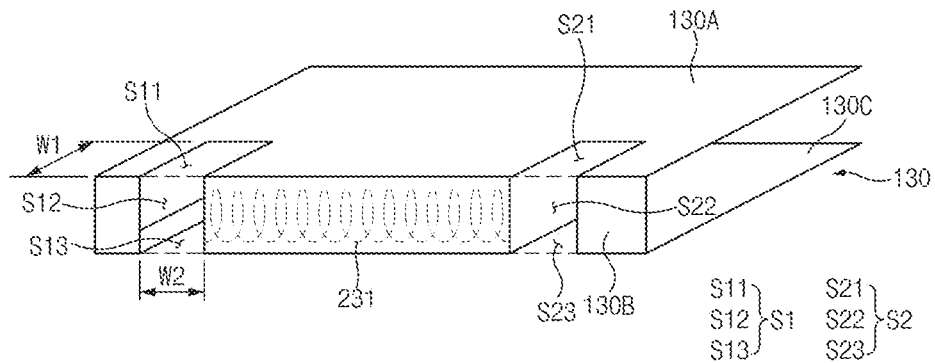
FIG. 10C illustrates a tenth slit structure formed around a receiving coil of a foldable electronic device according to an embodiment.
Figure 10D:
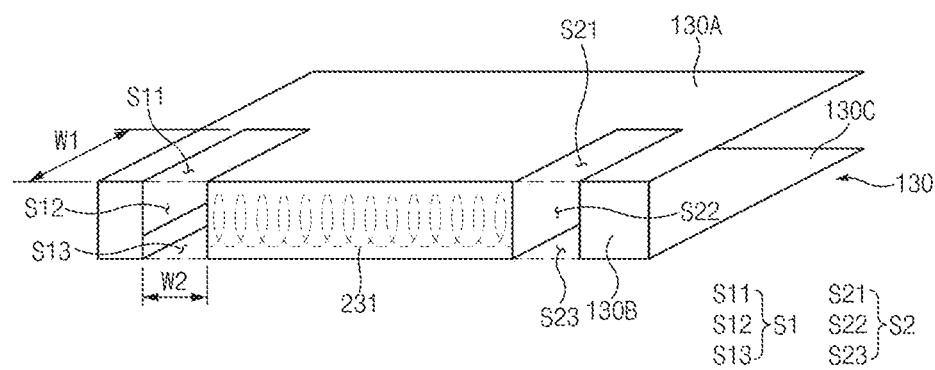
FIG. 10D illustrates an eleventh slit structure formed around a receiving coil of a foldable electronic device according to an embodiment.

FIG. 10A illustrates an eighth slit structure formed around a receiving coil of a foldable electronic device according to an embodiment. FIG. 10B illustrates a ninth slit structure formed around a receiving coil of a foldable electronic device according to an embodiment. FIG. 10C illustrates a tenth slit structure formed around a receiving coil of a foldable electronic device according to an embodiment. FIG. 10D illustrates an eleventh slit structure formed around a receiving coil of a foldable electronic device according to an embodiment.

Using the slit structures illustrated in FIGS. 10A to 10D, the results shown in Table 3 below may be derived based on the electric power transmission/reception relationship of FIG. 7.

slit S1 is formed in the first magnetic field area 130 adjacent to the first end of the receiving coil 231 (e.g., the left end of the receiving coil 231). The first slit S1 includes the second opening S12. The second opening S12 is formed on the first side surface 130B adjacent to the first end of the receiving coil 231. The second width W2 of the second opening S12 may have a set length (e.g., 10 mm).

The second slit S2 is formed in the first magnetic field area 130 adjacent to the second end of the receiving coil 231 (e.g., the right end of the receiving coil 231). The second slit S2 includes the fifth opening S22. The fifth opening S22 is formed on the first side surface 130B adjacent to the second end of the receiving coil 231. The fifth opening S22 may have a width (e.g., 10 mm) that is equal to the second width W2 of the second opening S12.

As shown in Table 3 above, according to the eighth slit structure, an electric current with a second magnitude is non-measurable when 9 W (or 5 W) of electric power is supplied from the wireless charging device 220 to the foldable electronic device 230.

Referring to FIG. 10B, the first slit S1 and the second slit S2 are formed in the first magnetic field area 130. The first slit S1 is formed in the first magnetic field area 130 adjacent to the first end of the receiving coil 231. The first slit S1 includes the first opening S11, the second opening S12, and the third opening S13. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm) The third opening S13 is formed on the first rear surface 130C adjacent to the first end of the receiving coil 231. The third opening S13 may have a width that is equal to the first width W1 of the first opening S11.

The second slit S2 is formed in the first magnetic field area 130 adjacent to the second end of the receiving coil 231. The second slit S2 includes the fourth opening S21, the fifth opening S22, and the sixth opening S23. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width that is equal to the first width W1 of the first opening S11.

TABLE 3

| Test 3 | 9 W | | | | | 5 W | | | | |
|---|---|---|---|---|---|---|---|---|---|---|
| | I in (mA) | V in (V) | I out (mA) | V out (V) | Efficiency (%) | I in (mA) | V in (V) | I out (mA) | V out (V) | Efficiency (%) |
| FIG. 10A | Non-measurable | | | | | Non-measurable | | | | |
| FIG. 10B | 1,705 | 9 | 1,000 | 9 | 58.65 | 1,729 | 5 | 1,000 | 5 | 57.84 |
| FIG. 10C | 1,702 | 9 | 1,000 | 9 | 58.75 | 1,730 | 5 | 1,000 | 5 | 57.8 |
| FIG. 10D | 1,705 | 9 | 1,000 | 9 | 58.65 | 1,726 | 5 | 1,000 | 3 | 57.87 |

Referring to FIG. 10A, the receiving coil 231 is disposed in the first magnetic field area 130 of the housing. The first As shown in Table 3 above, according to the ninth slit structure, an electric current with a second magnitude (e.g., I in=1,000 mA) is measured when 9 W of electric power (I in=1,705 mA) is supplied from the wireless charging device 220 to the foldable electronic device 230. The electric current with the second magnitude (e.g., I in=1,000 mA) has an efficiency of 58.65%, compared to the 9 W of electric power (I in=1,705 mA) that is supplied from the wireless charging device 220 to the foldable electronic device 230. An electric current with a second magnitude (e.g., I in=1,000 mA) is measured when 5 W of electric power (I in=1,729 mA) is supplied from the wireless charging device 220 to the foldable electronic device 230. The electric current with the second magnitude (e.g., I in=1,000 mA) has an efficiency of 57.84%, compared to the 5 W of electric power (I in=1,729 mA) that is supplied from the wireless charging device 220 to the foldable electronic device 230.

Referring to FIG. 10C, the first slit S1 and the second slit S2 are formed in the first magnetic field area 130. The first slit S1 is formed in the first magnetic field area 130 adjacent to the first end of the receiving coil 231. The first slit S1 includes the first opening S11, the second opening S12, and the third opening S13. The first opening S11 is formed on the first front surface 130A adjacent to the first end of the receiving coil 231. The first width W1 of the first opening S11 may have a length (e.g., 20 mm) that is greater than the height of the short axis of the receiving coil 231. The second opening S12 is formed on the first side surface 130B adjacent to the first end of the receiving coil 231. The second width W2 of the second opening S12 may have a set length (e.g., 10 mm) The third opening S13 is formed on the first rear surface 130C adjacent to the first end of the receiving coil 231. The third opening S13 may have a width (e.g., 20 mm) that is equal to the first width W1 of the first opening S11.

The second slit S2 is formed in the first magnetic field area 130 adjacent to the second end of the receiving coil 231. The second slit S2 includes the fourth opening S21, the fifth opening S22, and the sixth opening S23. The fourth opening S21 is formed on the first front surface 130A adjacent to the second end of the receiving coil 231. The fourth opening S21 may have a width (e.g., 20 mm) that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width (e.g., 20 mm) that is equal to the first width W1 of the first opening S11.

As shown in Table 3 above, according to the tenth slit structure, an electric current with a second magnitude (e.g., I in=1,000 mA) is measured when 9 W of electric power (I in=1,702 mA) is supplied from the wireless charging device 220 to the foldable electronic device 230. The electric current with the second magnitude (e.g., I in=1,000 mA) has an efficiency of 58.75%, compared to the 9 W of electric power (I in=1,702 mA) that is supplied from the wireless charging device 220 to the foldable electronic device 230. An electric current with a second magnitude (e.g., I in=1,000 mA) is measured when 5 W of electric power (I in=1,730 mA) is supplied from the wireless charging device 220 to the foldable electronic device 230. The electric current with the second magnitude (e.g., I in=1,000 mA) has an efficiency of 57.8%, compared to the 5 W of electric power (I in=1,730 mA) that is supplied from the wireless charging device 220 to the foldable electronic device 230.

Referring to FIG. 10D, the first slit S1 and the second slit S2 are formed in the first magnetic field area 130. The first slit S1 is formed in the first magnetic field area 130 adjacent to the first end of the receiving coil 231. The first slit S1 includes the first opening S11, the second opening S12, and the third opening S13. The first opening S11 is formed on the first front surface 130A adjacent to the first end of the receiving coil 231. The first width W1 of the first opening S11 may have a length (e.g., 30 mm) that is greater than the height of the short axis of the receiving coil 231. The second opening S12 is formed on the first side surface 130B adjacent to the first end of the receiving coil 231. The second width W2 of the second opening S12 may have a set length (e.g., 10 mm) The third opening S13 is formed on the first rear surface 130C adjacent to the first end of the receiving coil 231. The third opening S13 may have a width (e.g., 30 mm) that is equal to the first width W1 of the first opening S11.

The second slit S2 is formed in the first magnetic field area 130 adjacent to the second end of the receiving coil 231. The second slit S2 includes the fourth opening S21, the fifth opening S22, and the sixth opening S23. The fourth opening S21 is formed on the first front surface 130A adjacent to the second end of the receiving coil 231. The fourth opening S21 may have a width (e.g., 30 mm) that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width (e.g., 30 mm) that is equal to the first width W1 of the first opening S11.

As shown in Table 3 above, according to the eleventh slit structure des, an electric current with a second magnitude (e.g., I in=1,000 mA) is measured when 9 W of electric power (I in=1,702 mA) is supplied from the wireless charging device 220 to the foldable electronic device 230. The electric current with the second magnitude (e.g., I in=1,000 mA) has an efficiency of 58.75%, compared to the 9 W of electric power (I in=1,702 mA) that is supplied from the wireless charging device 220 to the foldable electronic device 230. An electric current with a second magnitude (e.g., I in=1,000 mA) is measured when 5 W of electric power (I in=1,728 mA) is supplied from the wireless charging device 220 to the foldable electronic device 230. The electric current with the second magnitude (e.g., I in=1,000 mA) has an efficiency of 57.87%, compared to the 5 W of electric power (I in=1,728 mA) that is supplied from the wireless charging device 220 to the foldable electronic device 230.

Figure 11A:
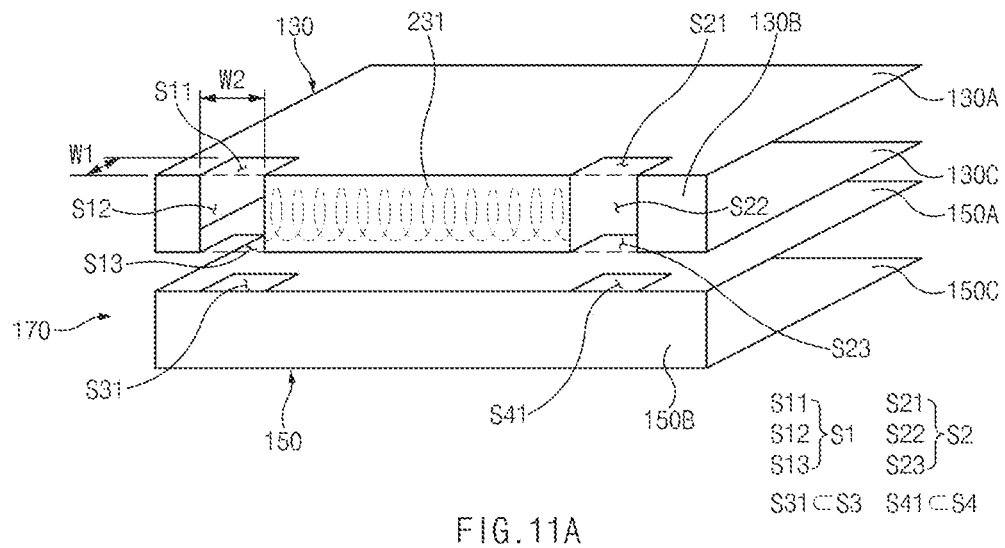
FIG. 11A illustrates a twelfth slit structure formed around a receiving coil of a foldable electronic device according an embodiment.
Figure 11B:
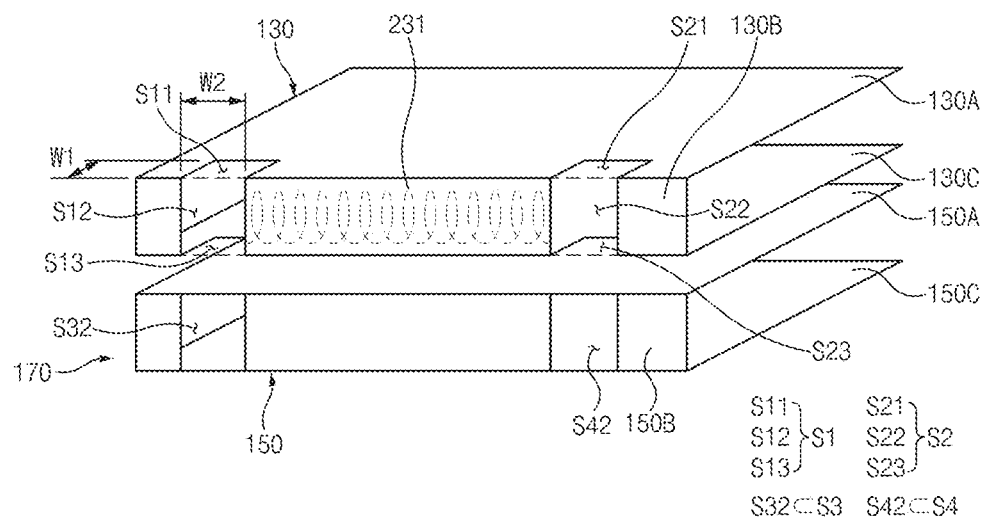
FIG. 11B illustrates a thirteenth slit structure formed around a receiving coil of a foldable electronic device according to an embodiment.
Figure 11C:
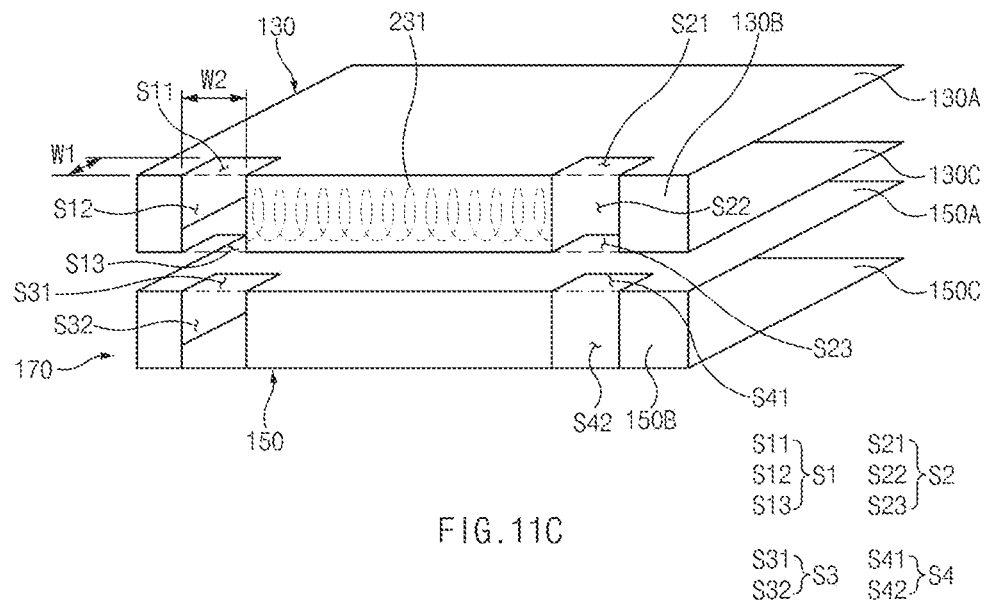
FIG. 11C illustrates a fourteenth slit structure formed around a receiving coil of a foldable electronic device according to an embodiment.
Figure 11D:
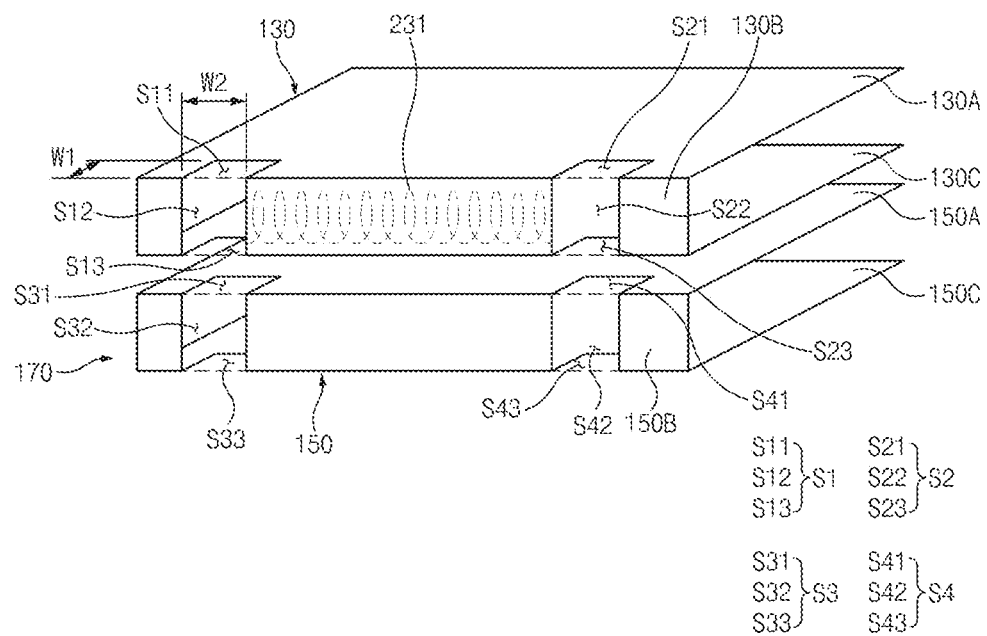
FIG. 11D illustrates a fifteenth slit structure formed around a receiving coil of a foldable electronic device according to an embodiment.

FIG. 11A illustrates a twelfth slit structure formed around a receiving coil of a foldable electronic device according to an embodiment. FIG. 11B illustrates a thirteenth slit structure formed around a receiving coil of a foldable electronic device according to the an embodiment. FIG. 11C illustrates a fourteenth slit structure formed around a receiving coil of a foldable electronic device according to the an embodiment. FIG. 11D illustrates a fifteenth slit structure formed around a receiving coil of a foldable electronic device according to an embodiment.

Using the slit structures illustrated in FIGS. 11A to 11D, the results shown in Table 4 below may be derived based on the electric power transmission/reception relationship of FIG. 7.

TABLE 4

| Test 4 | 9 W | | | | | 5 W | | | | |
|---|---|---|---|---|---|---|---|---|---|---|
| | I in (mA) | V in (V) | I out (mA) | V out (V) | Efficiency (%) | I in (mA) | V in (V) | I out (mA) | V out (V) | Efficiency (%) |
| FIG. 11A | Non-measurable | | | | | Non-measurable | | | | |
| FIG. 11B | Non-measurable | | | | | Non-measurable | | | | |
| FIG. 11C | 1,709 | 9 | 1,000 | 9 | 58.51 | 1,732 | 5 | 1,000 | 5 | 57.74 |
| FIG. 11D | 1,708 | 9 | 1,000 | 9 | 58.55 | 1,736 | 5 | 1,000 | 5 | 57.6 |

Referring to FIG. 11A, the receiving coil 231 is disposed in the first magnetic field area 130 of the housing. The housing is in the folded state. The first slit S1 and the second slit S2 are formed in the first magnetic field area 130.

The first slit S1 is formed in the first magnetic field area 130 adjacent to the first end of the receiving coil 231 (e.g., the left end of the receiving coil 231). The first slit S1 includes the first opening S11, the second opening S12, and the third opening S13. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm) The third opening S13 is formed on the first rear surface 130C adjacent to the first end of the receiving coil 231. The third opening S13 may have a width that is equal to the first width W1 of the first opening S11 (e.g., equal to the height of the short axis of the receiving coil 231).

The second slit S2 is formed in the first magnetic field area 130 adjacent to the second end of the receiving coil 231 (e.g., the right end of the receiving coil 231). The second slit S2 includes the fourth opening S21, the fifth opening S22, and the sixth opening S23. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width that is equal to the first width W1 of the first opening S11.

The third slit S3 and the fourth slit S4 are formed in the second magnetic field area 150 corresponding to the first receiving coil 231. The third slit S3 is formed in the second magnetic field area 150 adjacent to the first end of the receiving coil 231. The third slit S3 includes the seventh opening S31. The seventh opening S31 is formed on the second front surface 150A adjacent to the first end of the receiving coil 231. The first width W1 of the seventh opening S31 may be equal to the first width W1 of the first opening S11 (e.g., equal to the height of the short axis of the receiving coil 231). The fourth slit S4 is formed in the second magnetic field area 150 adjacent to the second end of the receiving coil 231. The fourth slit S4 includes the tenth opening S41. The tenth opening S41 is formed on the second front surface 150A adjacent to the second end of the receiving coil 231. The tenth opening S41 may have a width that is equal to the first width W1 of the first opening S11.

As shown in Table 4 above, according to the twelfth slit structure, an electric current with a second magnitude is non-measurable when 9 W (or 5 W) of electric power is supplied from the wireless charging device 220 to the foldable electronic device 230.

Referring to FIG. 11B, the first slit S1 and the second slit S2 are formed in the first magnetic field area 130, and the third slit S3 and the fourth slit S4 are formed in the second magnetic field area 150. The first slit S1 is formed in the first magnetic field area 130 adjacent to the first end of the receiving coil 231. The first slit S1 includes the first opening S11, the second opening S12, and the third opening S13. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm). The third opening S13 is formed on the first rear surface 130C adjacent to the first end of the receiving coil 231. The third opening S13 may have a width that is equal to the first width W1 of the first opening S11.

The second slit S2 is formed in the first magnetic field area 130 adjacent to the second end of the receiving coil 231. The second slit S2 includes the fourth opening S21, the fifth opening S22, and the sixth opening S23. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width that is equal to the first width W1 of the first opening S11.

The third slit S3 and the fourth slit S4 are formed in the second magnetic field area 150 corresponding to the first receiving coil 231. The third slit S3 is formed in the second magnetic field area 150 adjacent to the first end of the receiving coil 231. The third slit S3 includes the eighth opening S32. The eighth opening S32 is formed on the second side surface 150B adjacent to the first end of the receiving coil 231. The eighth opening S32 may have a width equal to the second width W2 of the second opening S12.

The fourth slit S4 is formed in the second magnetic field area 150 adjacent to the second end of the receiving coil 231. The fourth slit S4 includes the eleventh opening S42. The eleventh opening S42 is formed on the second side surface 150B adjacent to the second end of the receiving coil 231. The eleventh opening S42 may have a width equal to the second width W2 of the second opening S12.

As shown in Table 4 above, according to the thirteenth slit structure, an electric current with a second magnitude is non-measurable when 9 W (or 5 W) of electric power is supplied from the wireless charging device 220 to the foldable electronic device 230.

Referring to FIG. 11C, the first slit S1 and the second slit S2 are formed in the first magnetic field area 130, and the third slit S3 and the fourth slit S4 are formed in the second magnetic field area 150. The first slit S1 is formed in the first magnetic field area 130 adjacent to the first end of the receiving coil 231. The first slit S1 includes the first opening S11, the second opening S12, and the third opening S13. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm). The third opening S13 is formed on the first rear surface 130C adjacent to the first end of the receiving coil 231. The third opening S13 may have a width that is equal to the first width W1 of the first opening S11.

The second slit S2 is formed in the first magnetic field area 130 adjacent to the second end of the receiving coil 231. The second slit S2 includes the fourth opening S21, the fifth opening S22, and the sixth opening S23. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width that is equal to the first width W1 of the first opening S11.

The third slit S3 and the fourth slit S4 are formed in the second magnetic field area 150 corresponding to the first receiving coil 231. The third slit S3 is formed in the second magnetic field area 150 adjacent to the first end of the receiving coil 231. The third slit S3 includes the seventh opening S31 and the eighth opening S32. The seventh opening S31 is formed on the second front surface 150A adjacent to the first end of the receiving coil 231. The seventh opening S31 may have a width that is equal to the first width W1 of the first opening S11. The eighth opening S32 is formed on the second side surface 150B adjacent to the first end of the receiving coil 231. The eighth opening S32 may have a width (e.g., 10 mm) that is equal to the second width W2 of the second opening S12.

The fourth slit S4 is formed in the second magnetic field area 150 adjacent to the second end of the receiving coil 231. The fourth slit S4 includes the tenth opening S41 and the eleventh opening S42. The tenth opening S41 is formed on the second front surface 150A adjacent to the second end of the receiving coil 231. The tenth opening S41 may have a width that is equal to the first width W1 of the first opening S11. The eleventh opening S42 is formed on the second side surface 150B adjacent to the second end of the receiving coil 231. The eleventh opening S42 may have a width (e.g., 10 mm) that is equal to the second width W2 of the second opening S12.

As shown in Table 4 above, according to the fourteenth slit structure, an electric current with a second magnitude (e.g., I in=1,000 mA) is measured when 9 W of electric power (I in=1,709 mA) is supplied from the wireless charging device 220 to the foldable electronic device 230. The electric current with the second magnitude (e.g., I in=1,000 mA) has an efficiency of 58.51%, compared to the 9 W of electric power (I in=1,709 mA) that is supplied from the wireless charging device 220 to the foldable electronic device 230. An electric current with a second magnitude (e.g., I in=1,000 mA) is measured when 5 W of electric power (I in=1,732 mA) is supplied from the wireless charging device 220 to the foldable electronic device 230. The electric current with the second magnitude (e.g., I in=1,000 mA) has an efficiency of 57.74%, compared to the 5 W of electric power (I in=1,732 mA) that is supplied from the wireless charging device 220 to the foldable electronic device 230.

Referring to FIG. 11D, the first slit S1 and the second slit S2 are formed in the first magnetic field area 130, and the third slit S3 and the fourth slit S4 are formed in the second magnetic field area 150. The first slit S1 is formed in the first magnetic field area 130 adjacent to the first end of the receiving coil 231. The first slit S1 includes the first opening S11, the second opening S12, and the third opening S13. The first opening S11 is formed on the first front surface 130A adjacent to the first end of the receiving coil 231. The first width W1 of the first opening S11 may be equal to the height of the short axis of the receiving coil 231. The second opening S12 is formed on the first side surface 130B adjacent to the first end of the receiving coil 231. The second width W2 of the second opening S12 may have a set length (e.g., 10 mm) The third opening S13 is formed on the first rear surface 130C adjacent to the first end of the receiving coil 231. The third opening S13 has a width that is equal to the first width W1 of the first opening S11.

The second slit S2 is formed in the first magnetic field area 130 adjacent to the second end of the receiving coil 231. The second slit S2 includes the fourth opening S21, the fifth opening S22, and the sixth opening S23. The fourth opening S21 is formed on the first front surface 130A adjacent to the second end of the receiving coil 231. The fourth opening S21 may have a width that is equal to the first width W1 of the first opening S11. The fifth opening S22 is formed on the first side surface 130B adjacent to the second end of the receiving coil 231. The fifth opening S22 may have a width (e.g., 10 mm) that is equal to the second width W2 of the second opening S12. The sixth opening S23 is formed on the first rear surface 130C adjacent to the second end of the receiving coil 231. The sixth opening S23 may have a width that is equal to the first width W1 of the first opening S11.

The third slit S3 and the fourth slit S4 are formed in the second magnetic field area 150 corresponding to the first receiving coil 231. The third slit S3 is formed in the second magnetic field area 150 adjacent to the first end of the receiving coil 231. The third slit S3 includes the seventh opening S31, the eighth opening S32, and the ninth opening S33. The seventh opening S31 is formed on the second front surface 150A adjacent to the first end of the receiving coil 231. The seventh opening S31 may have a width that is equal to the first width W1 of the first opening S11. The eighth opening S32 is formed on the second side surface 150B adjacent to the first end of the receiving coil 231. The eighth opening S32 may have a width (e.g., 10 mm) that is equal to the second width W2 of the second opening S12. The ninth opening S33 is formed on the second rear surface 150C adjacent to the first end of the receiving coil 231. The ninth opening S33 may have a width that is equal to the first width W1 of the first opening S11.

The fourth slit S4 is formed in the second magnetic field area 150 adjacent to the second end of the receiving coil 231. The fourth slit S4 includes the tenth opening S41, the eleventh opening S42, and the twelfth opening S43. The tenth opening S41 is formed on the second front surface 150A adjacent to the second end of the receiving coil 231. The tenth opening S41 may have a width that is equal to the first width W1 of the first opening S11. The eleventh opening S42 is formed on the second side surface 150B adjacent to the second end of the receiving coil 231. The eleventh opening S42 may have a width (e.g., 10 mm) that is equal to the second width W2 of the second opening S12. The twelfth opening S43 is formed on the second rear surface 150C adjacent to the second end of the receiving coil 231. The twelfth opening S43 may have a width that is equal to the first width W1 of the first opening S11.

As shown in Table 4 above, according to the fifteenth slit structure, an electric current with a second magnitude (e.g., I in=1,000 mA) is measured when 9 W of electric power (I in=1,708 mA) is supplied from the wireless charging device 220 to the foldable electronic device 230. The electric current with the second magnitude (e.g., I in=1,000 mA) has an efficiency of 58.55%, compared to the 9 W of electric power (I in=1,708 mA) that is supplied from the wireless charging device 220 to the foldable electronic device 230. An electric current with a second magnitude (e.g., I in=1,000 mA) is measured when 5 W of electric power (I in=1,736 mA) is supplied from the wireless charging device 220 to the foldable electronic device 230. The electric current with the second magnitude (e.g., I in=1,000 mA) has an efficiency of 57.6%, compared to the 5 W of electric power (I in=1,736 mA) that is supplied from the wireless charging device 220 to the foldable electronic device 230.

As described above, different slit structures may be used depending on a flat state or a folded state of the housing. When the housing is in a flat state, the first slit S1 and the second slit S2 may be used. When the housing is in a folded state, the first slit S1, the second slit S2, and the third slit S3 may be used, or the first slit S1, the second slit S2, the third slit S3, and the fourth slit S4 may all be used.

Figure 12A:
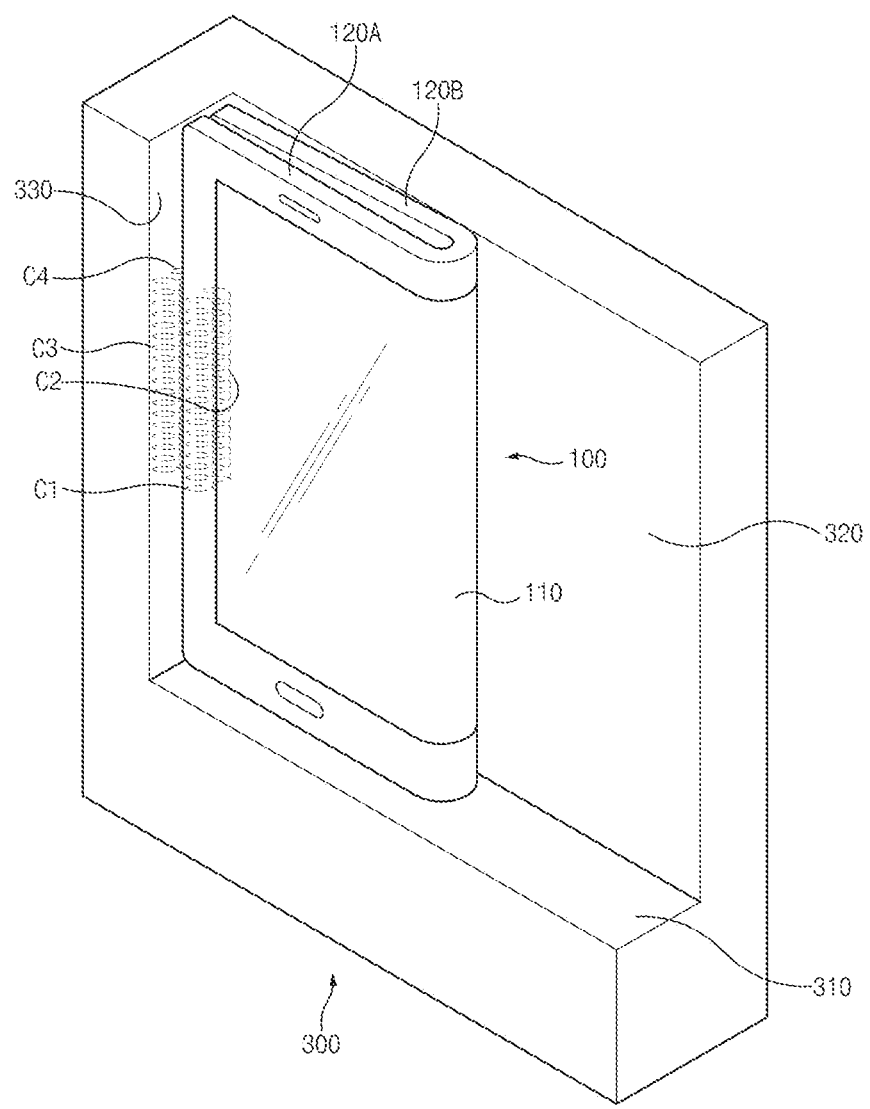
FIG. 12A illustrates a foldable electronic device and a wireless charging device according to an embodiment.

FIG. 12A illustrates a foldable electronic device and a wireless charging device according to an embodiment.

Referring to FIG. 12A, a foldable electronic device 100 is placed on a wireless charging device 300 in the folded state. The wireless charging device 300 includes a first mounting surface 310, a second mounting surface 320, and a third mounting surface 330 on which the foldable electronic device 100 is mounted. The first mounting surface 310 may support a lower portion (or an upper portion) of the foldable electronic device 100. The second mounting surface 320 may support the display 110 of the foldable electronic device 100. The third mounting surface 330 may support a third magnetic field area of the foldable electronic device 100.

The first receiving coil C1 is disposed in a first magnetic field area that is adjacent to the third mounting surface 330. A first transmitting coil C3 is disposed on the third mounting surface 330 adjacent to the first magnetic field area. The first transmitting coil C3 may form a first magnetic field using electric power supplied to the wireless charging device 300. The first magnetic field may have different polarities on both sides. When the first magnetic field is generated, the first receiving coil C1 may generate an induced current corresponding to the electric power of the wireless charging device 300 and may form a second magnetic field corresponding to the first magnetic field. The second magnetic field may include, on both sides, polarities opposite to the polarities on the both sides of the first magnetic field. Accordingly, the foldable electronic device 100 may charge a battery therein by using the induced current of the first receiving coil C1.

The second receiving coil C2 is disposed in a second magnetic field area that is adjacent to the third mounting surface 330. A second transmitting coil C4 is disposed on the third mounting surface 330 adjacent to the second magnetic field area. The second transmitting coil C4 may form a third magnetic field by electric power supplied to the wireless charging device 300. The third magnetic field may have different polarities on both sides, but the polarities may be the same as the polarities on both the sides of the first transmitting coil C3. When the third magnetic field is generated, the second receiving coil C2 may generate an induced current corresponding to the electric power of the wireless charging device 300 and may form a fourth magnetic field corresponding to the third magnetic field. When spaced apart from the first transmitting coil C3 by a predetermined distance, the second receiving coil C2 may be moved closed to the second transmitting coil C4 by a predetermined distance to form the fourth magnetic field, thereby preventing interference with the first receiving coil C1. The fourth magnetic field may include, on both sides, polarities opposite to the polarities on both the sides of the third magnetic field. However, the polarities on both the sides of the fourth magnetic field may be the same as the polarities on both the sides of the first receiving coil C1. Accordingly, the foldable electronic device 100 may charge the battery therein by using the induced current of the second receiving coil C2.

Figure 12B:
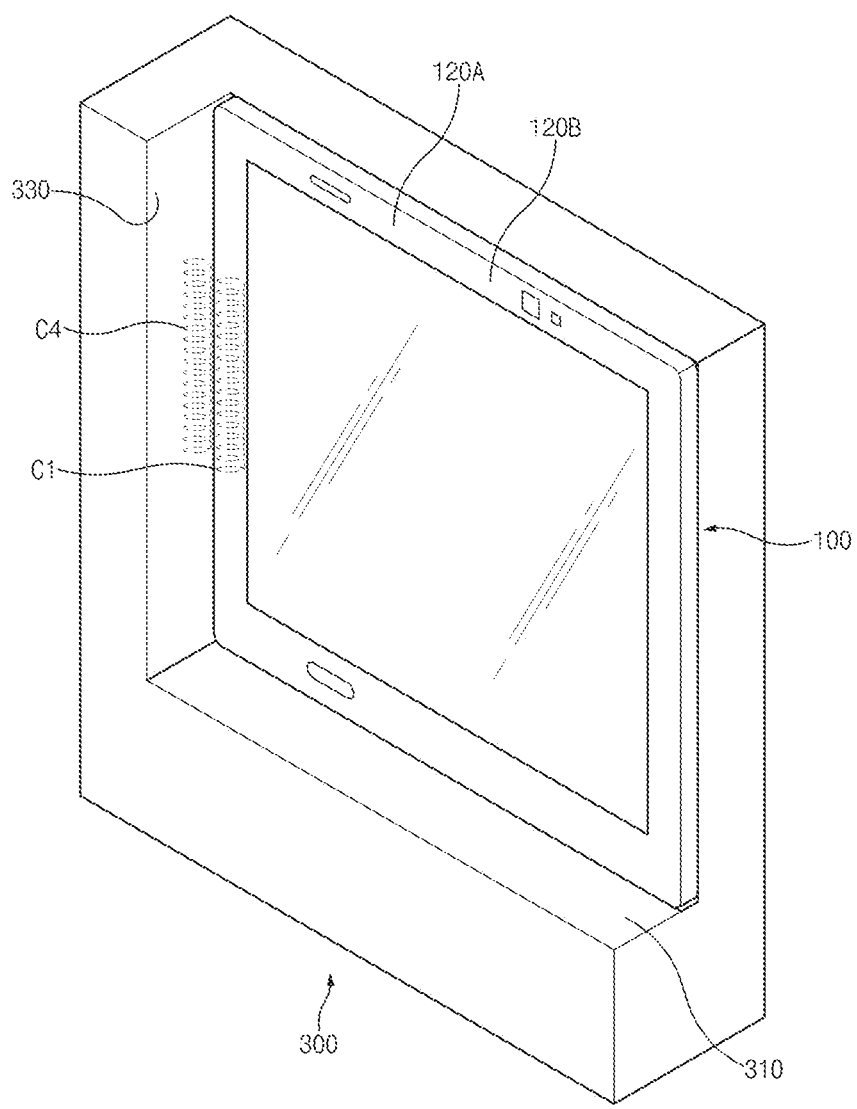
FIG. 12B illustrates a foldable electronic device and a wireless charging device according to an embodiment.

FIG. 12B illustrates a foldable electronic device and a wireless charging device according to an embodiment.

Referring to FIG. 12B, a foldable electronic device 100 is placed on a wireless charging device 300 in the flat state. The wireless charging device 300 includes the first mounting surface 310, a second mounting surface, and the third mounting surface 330 on which the foldable electronic device 100 is mounted. The first mounting surface 310 may support a lower portion (or an upper portion) of the foldable electronic device 100. The second mounting surface may support the rear surface of the housing of the foldable electronic device 100. The third mounting surface 330 may support a magnetic field area of the foldable electronic device 100.

The first receiving coil C1 is disposed in the magnetic field area that is adjacent to the third mounting surface 330. The second transmitting coil C4 is disposed on the third mounting surface 330 adjacent to the magnetic field area. The second transmitting coil C4 may form the third magnetic field using electric power supplied to the wireless charging device 300. The third magnetic field may have different polarities on both sides. When the third magnetic field is generated, the first receiving coil C1 may generate an induced current corresponding to the electric power of the wireless charging device 300 and may form the second magnetic field corresponding to the third magnetic field. The second magnetic field may include, on both sides, polarities opposite to the polarities on both the sides of the third magnetic field. Accordingly, the foldable electronic device 100 may charge a battery therein by using the induced current of the first receiving coil C1.

According to an embodiment, a foldable electronic device may include a display, a first housing structure, and a second housing structure. The display may have an arrangement state varying depending on a folded state in which a first display area and a second display area are arranged in different directions or a flat state in which the first display area and the second display area are arranged in the same direction. The first housing structure may surround at least part of the first display area. The second housing structure may be connected to the first housing structure and may surround at least part of the second display area. A first receiving coil C1 may be disposed in a first magnetic field area at an edge of the first housing structure.

The first housing structure may include a first slit. The first slit may have at least one of a first opening formed on a first front surface of the first magnetic field area adjacent to a first end of the first receiving coil, a second opening formed on a first side surface of the first magnetic field area adjacent to the first end of the first receiving coil, and a third opening formed on a first rear surface of the first magnetic field area adjacent to the first end of the first receiving coil.

A first width of the first opening may have at least a length equal to a height of a short axis of the first receiving coil.

The first housing structure may include a second slit. The second slit may have at least one of a fourth opening formed on the first front surface of the first magnetic field area adjacent to a second end of the first receiving coil, a fifth opening formed on the first side surface of the first magnetic field area adjacent to the second end of the first receiving coil, and a sixth opening formed on the first rear surface of the first magnetic field area adjacent to the second end of the first receiving coil.

The first slit and the second slit may be disposed to correspond to each other with the first receiving coil therebetween.

A second magnetic field area corresponding to the first magnetic field area may be formed at an edge of the second housing structure.

The second housing structure may include a third slit. The third slit may have at least one of a seventh opening formed on a second front surface of the second magnetic field area adjacent to a first end of the first receiving coil, an eighth opening formed on a second side surface of the second magnetic field area adjacent to the first end of the first receiving coil, and a ninth opening formed on a second rear surface of the second magnetic field area adjacent to the first end of the first receiving coil.

A first width of the seventh opening may have at least a length equal to a height of a short axis of the first receiving coil.

The second housing structure may include a fourth slit. The fourth slit may have at least one of a tenth opening formed on the second front surface of the second magnetic field area adjacent to a second end of the first receiving coil, an eleventh opening formed on the second side surface of the second magnetic field area adjacent to the second end of the first receiving coil, and a twelfth opening formed on the second rear surface of the second magnetic field area adjacent to the second end of the first receiving coil.

The third slit and the fourth slit may be disposed to correspond to each other with the first receiving coil therebetween when the first display area and the second display area are in the folded state.

The first receiving coil may form a second magnetic field when a first magnetic field of a first transmitting coil approaches the first receiving coil by a predetermined distance.

The first receiving coil may include at least a solenoid coil.

A second receiving coil corresponding to the first receiving coil may be disposed in a second magnetic field area at an edge of the second housing structure.

The second receiving coil may form a fourth magnetic field when a third magnetic field of a second transmitting coil approaches the second receiving coil by a predetermined distance.

The fourth magnetic field may have polarities in the same direction as polarities of a second magnetic field formed around the first receiving coil C1.

According to an embodiment, a foldable electronic device may include a display, a first housing structure, and a second housing structure. The display may have an arrangement state varying depending on a folded state in which a first display area and a second display area are arranged in different directions or a flat state in which the first display area and the second display area are arranged in the same direction. The first housing structure may surround at least part of the first display area. The second housing structure may be connected to the first housing structure and may surround at least part of the second display area. A first receiving coil may be disposed in a first magnetic field area at an edge of the first housing structure. The first housing structure may include at least one of a first slit formed in the first magnetic field area adjacent to a first end of the first receiving coil and a second slit formed in the first magnetic field area adjacent to a second end of the first receiving coil.

The first slit and the second slit may be disposed to correspond to each other with the first receiving coil therebetween.

A second magnetic field area corresponding to the first magnetic field area may be formed at an edge of the second housing structure.

The second housing structure may include at least one of a third slit formed in the second magnetic field area adjacent to the first end of the first receiving coil or a fourth slit formed in the second magnetic field area adjacent to the second end of the first receiving coil.

The third slit and the fourth slit may be disposed to correspond to each other with the first receiving coil therebetween when the first display area and the second display area are in the folded state.

Figure 13:
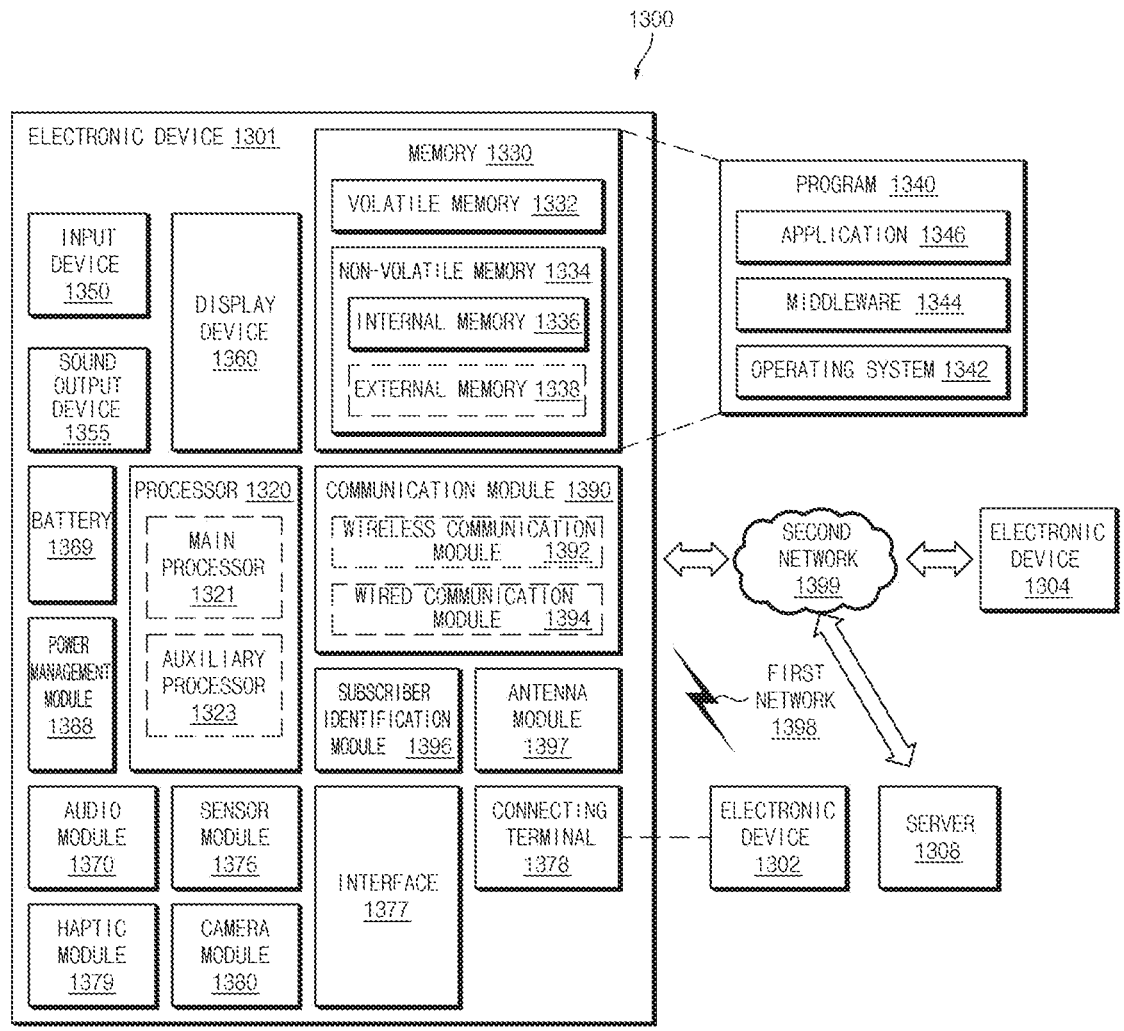
FIG. 13 illustrates an electronic device in a network environment according to an embodiment.

FIG. 13 illustrates an electronic device 1301 in a network environment 1300 according to an embodiment.

Referring to FIG. 13, the electronic device 1301 in the network environment 1300 may communicate with an electronic device 1302 via a first network 1398 (e.g., a short-range wireless communication network), or an electronic device 1304 or a server 1308 via a second network 1399 (e.g., a long-range wireless communication network). According to an embodiment, the electronic device 1301 may communicate with the electronic device 1304 via the server 1308. According to an embodiment, the electronic device 1301 may include a processor 1320, memory 1330, an input device 1350, a sound output device 1355, a display device 1360, an audio module 1370, a sensor module 1376, an interface 1377, a haptic module 1379, a camera module 1380, a power management module 1388, a battery 1389, a communication module 1390, a subscriber identification module (SIM) 1396, or an antenna module 1397. In some embodiments, at least one (e.g., the display device 1360 or the camera module 1380) of the components may be omitted from the electronic device 1301, or one or more other components may be added in the electronic device 1301. In some embodiments, some of the components may be implemented as single integrated circuitry. For example, the sensor module 1376 (e.g., a fingerprint sensor, an iris sensor, or an illuminance sensor) may be implemented as embedded in the display device 1360 (e.g., a display).

The processor 1320 may execute, for example, software (e.g., a program 1340) to control at least one other component (e.g., a hardware or software component) of the electronic device 1301 coupled with the processor 1320, and may perform various data processing or computation. According to one embodiment, as at least part of the data processing or computation, the processor 1320 may load a command or data received from another component (e.g., the sensor module 1376 or the communication module 1390) in volatile memory 1332, process the command or the data stored in the volatile memory 1332, and store resulting data in non-volatile memory 1334. According to an embodiment, the processor 1320 may include a main processor 1321 (e.g., a central processing unit (CPU) or an application processor (AP)), and an auxiliary processor 1323 (e.g., a graphics processing unit (GPU), an image signal processor (ISP), a sensor hub processor, or a communication processor (CP)) that is operable independently from, or in conjunction with, the main processor 1321. Additionally or alternatively, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display device 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment, the auxiliary processor 1323 (e.g., an ISP or a CP) may be implemented as part of another component (e.g., the camera module 1380 or the communication module 1390) functionally related to the auxiliary processor 1323.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input device 1350 may receive a command or data to be used by other component (e.g., the processor 1320) of the electronic device 1301, from the outside (e.g., a user) of the electronic device 1301. The input device 1350 may include, for example, a microphone, a mouse, a keyboard, or a digital pen (e.g., a stylus pen).

The sound output device 1355 may output sound signals to the outside of the electronic device 1301. The sound output device 1355 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1360 may visually provide information to the outside (e.g., a user) of the electronic device 1301. The display device 1360 may include, for example, a display, a hologram device, or a projector and control circuitry to control a corresponding one of the display, hologram device, and projector. According to an embodiment, the display device 1360 may include touch circuitry adapted to detect a touch, or sensor circuitry (e.g., a pressure sensor) adapted to measure the intensity of force incurred by the touch.

The audio module 1370 may convert a sound into an electrical signal and vice versa. According to an embodiment, the audio module 1370 may obtain the sound via the input device 1350, or output the sound via the sound output device 1355 or a headphone of an external electronic device (e.g., an electronic device 1302) directly (e.g., wiredly) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment, the sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1377 may support one or more specified protocols to be used for the electronic device 1301 to be coupled with the external electronic device (e.g., the electronic device 1302) directly (e.g., wiredly) or wirelessly. According to an embodiment, the interface 1377 may include, for example, a high definition multimedia interface (HDMI), a universal serial bus (USB) interface, a secure digital (SD) card interface, or an audio interface.

A connecting terminal 1378 may include a connector via which the electronic device 1301 may be physically connected with the external electronic device (e.g., the electronic device 1302). According to an embodiment, the connecting terminal 1378 may include, for example, an HDMI connector, a USB connector, an SD card connector, or an audio connector (e.g., a headphone connector).

The haptic module 1379 may convert an electrical signal into a mechanical stimulus (e.g., a vibration or a movement) or electrical stimulus which may be recognized by a user via his tactile sensation or kinesthetic sensation. According to an embodiment, the haptic module 1379 may include, for example, a motor, a piezoelectric element, or an electric stimulator.

The camera module 1380 may capture a still image or moving images. According to an embodiment, the camera module 1380 may include one or more lenses, image sensors, ISPs, or flashes.

The power management module 1388 may manage power supplied to the electronic device 1301. According to one embodiment, the power management module 1388 may be implemented as at least part of, for example, a power management integrated circuit (PMIC).

The battery 1389 may supply power to at least one component of the electronic device 1301. According to an embodiment, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the electronic device 1302, the electronic device 1304, or the server 1308) and performing communication via the established communication channel. The communication module 1390 may include one or more CPs that are operable independently from the processor 1320 (e.g., the AP) and supports a direct (e.g., wired) communication or a wireless communication. According to an embodiment, the communication module 1390 may include a wireless communication module 1392 (e.g., a cellular communication module, a short-range wireless communication module, or a global navigation satellite system (GNSS) communication module) or a wired communication module 1394 (e.g., a local area network (LAN) communication module or a power line communication (PLC) module). A corresponding one of these communication modules may communicate with the external electronic device via the first network 1398 (e.g., a short-range communication network, such as Bluetooth™, wireless-fidelity (Wi-Fi) direct, or infrared data association (IrDA)) or the second network 1399 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1392 may identify and authenticate the electronic device 1301 in a communication network, such as the first network 1398 or the second network 1399, using subscriber information (e.g., international mobile subscriber identity (IMSI)) stored in the subscriber identification module 1396.

The antenna module 1397 may transmit or receive a signal or power to or from the outside (e.g., the external electronic device) of the electronic device 1301. According to an embodiment, the antenna module 1397 may include an antenna including a radiating element composed of a conductive material or a conductive pattern formed in or on a substrate (e.g., PCB). According to an embodiment, the antenna module 1397 may include a plurality of antennas. In such a case, at least one antenna appropriate for a communication scheme used in the communication network, such as the first network 1398 or the second network 1399, may be selected, for example, by the communication module 1390 (e.g., the wireless communication module 1392) from the plurality of antennas. The signal or the power may then be transmitted or received between the communication module 1390 and the external electronic device via the selected at least one antenna. According to an embodiment, another component (e.g., a radio frequency integrated circuit (RFIC)) other than the radiating element may be additionally formed as part of the antenna module 1397.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1301 and the external electronic device 1304 via the server 1308 coupled with the second network 1399. Each of the electronic devices 1302 and 1304 may be a device of a same type as, or a different type, from the electronic device 1301. According to an embodiment, all or some of operations to be executed at the electronic device 1301 may be executed at one or more of the external electronic devices 1302, 1304, or 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1301. The electronic device 1301 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1340) including one or more instructions that are stored in a storage medium (e.g., internal memory 1336 or external memory 1338) that is readable by a machine (e.g., the electronic device 1301). For example, a processor (e.g., the processor 1320) of the machine (e.g., the electronic device 1301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment of the disclosure, a foldable electronic device may perform wireless charging using a receiving coil disposed on a side of the electronic device.

In addition, the disclosure may provide various effects that are directly or indirectly recognized.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A foldable electronic device, comprising:
   a display including a first display area and a second display area that face a same direction when the foldable electronic device is in a flat state;
   a first housing structure configured to surround at least part of the first display area;
   a second housing structure connected to the first housing structure and configured to surround at least part of the second display area; and
   a first receiving coil disposed in a first magnetic field area at an edge of the first housing structure.

2. The foldable electronic device of claim 1, wherein the first housing structure comprises a first slit including at least one of a first opening, a second opening, or a third opening, and
   wherein the first opening is formed on a first front surface of the first magnetic field area adjacent to a first end of the first receiving coil, the second opening is formed on a first side surface of the first magnetic field area adjacent to the first end of the first receiving coil, and the third opening is formed on a first rear surface of the first magnetic field area adjacent to the first end of the first receiving coil.

3. The foldable electronic device of claim 2, wherein a first width of the first opening is at least equal to a height of a short axis of the first receiving coil.

4. The foldable electronic device of claim 2, wherein the first housing structure comprises a second slit including at least one of a fourth opening, a fifth opening, or a sixth opening, and
   wherein the fourth opening is formed on the first front surface of the first magnetic field area adjacent to a second end of the first receiving coil, the fifth opening is formed on the first side surface of the first magnetic field area adjacent to the second end of the first receiving coil, and the sixth opening is formed on the first rear surface of the first magnetic field area adjacent to the second end of the first receiving coil.

5. The foldable electronic device of claim 4, wherein the first slit and the second slit correspond to each other with the first receiving coil therebetween.

6. The foldable electronic device of claim 1, wherein a second magnetic field area corresponding to the first magnetic field area is formed at an edge of the second housing structure.

7. The foldable electronic device of claim 6, wherein the second housing structure comprises a third slit including at least one of a seventh opening, an eighth opening, or a ninth opening, and
   wherein the seventh opening is formed on a second front surface of the second magnetic field area adjacent to a first end of the first receiving coil, the eighth opening is formed on a second side surface of the second magnetic field area adjacent to the first end of the first receiving coil, and the ninth opening is formed on a second rear surface of the second magnetic field area adjacent to the first end of the first receiving coil.

8. The foldable electronic device of claim 7, wherein a first width of the seventh opening is at least equal to a height of a short axis of the first receiving coil.

9. The foldable electronic device of claim 7, wherein the second housing structure comprises a fourth slit including at least one of a tenth opening, an eleventh opening, or a twelfth opening, and
   wherein the tenth opening is formed on the second front surface of the second magnetic field area adjacent to a second end of the first receiving coil, the eleventh opening is formed on the second side surface of the second magnetic field area adjacent to the second end of the first receiving coil, and the twelfth opening is formed on the second rear surface of the second magnetic field area adjacent to the second end of the first receiving coil.

10. The foldable electronic device of claim 9, wherein the third slit and the fourth slit correspond to each other with the first receiving coil therebetween, when the foldable electronic device is in a folded state.

11. The foldable electronic device of claim 1, wherein the first receiving coil forms a second magnetic field when a first magnetic field of a first transmitting coil is within a predetermined distance of the first receiving coil.

12. The foldable electronic device of claim 1, wherein the first receiving coil includes a solenoid coil.

13. The foldable electronic device of claim 1, wherein a second receiving coil corresponding to the first receiving coil is disposed in a second magnetic field area at an edge of the second housing structure.

14. The foldable electronic device of claim 13, wherein the second receiving coil forms a second magnetic field when a first magnetic field of a second transmitting coil is within a predetermined distance of the second receiving coil.

15. The foldable electronic device of claim 14, wherein the second magnetic field has polarities in a same direction as polarities of a third magnetic field formed around the first receiving coil.

16. A foldable electronic device, comprising:
- a display including a first display area and a second display area that are arranged in a same direction when the foldable electronic device is in a flat state;
- a first housing structure configured to surround at least part of the first display area;
- a second housing structure connected to the first housing structure and configured to surround at least part of the second display area; and
- a first receiving coil disposed in a first magnetic field area at an edge of the first housing structure,
- wherein the first housing structure includes at least one of a first slit formed in the first magnetic field area adjacent to a first end of the first receiving coil or a second slit formed in the first magnetic field area adjacent to a second end of the first receiving coil.

17. The foldable electronic device of claim 16, wherein the first receiving coil is position between the first slit and the second slit.

18. The foldable electronic device of claim 16, wherein a second magnetic field area corresponding to the first magnetic field area is formed at an edge of the second housing structure.

19. The foldable electronic device of claim 18, wherein the second housing structure includes at least one of a third slit formed in the second magnetic field area adjacent to the first end of the first receiving coil or a fourth slit formed in the second magnetic field area adjacent to the second end of the first receiving coil.

20. The foldable electronic device of claim 19, wherein the first receiving coil is position between the third slit and the fourth slit when the foldable electronic device is in a folded state.

* * * * *